(12) United States Patent
Mudge et al.

(10) Patent No.: US 7,162,661 B2
(45) Date of Patent: Jan. 9, 2007

(54) SYSTEMATIC AND RANDOM ERROR DETECTION AND RECOVERY WITHIN PROCESSING STAGES OF AN INTEGRATED CIRCUIT

(75) Inventors: Trevor Nigel Mudge, Ann Arbor, MI (US); Todd Michael Austin, Ann Arbor, MI (US); David Theodore Blaauw, Ann Arbor, MI (US); Krisztian Flautner, Cambridge (GB)

(73) Assignees: ARM Limited, Cambridge (GB); University of Michigan, Ann Arbor, MI (US)

( * ) Notice: Subject to any disclaimer, the term of this patent is extended or adjusted under 35 U.S.C. 154(b) by 522 days.

(21) Appl. No.: 10/779,805

(22) Filed: Feb. 18, 2004

(65) Prior Publication Data

US 2004/0243893 A1    Dec. 2, 2004

Related U.S. Application Data

(63) Continuation-in-part of application No. 10/392,382, filed on Mar. 20, 2003.

(51) Int. Cl.
*G06F 11/10*    (2006.01)
(52) U.S. Cl. .......................... 714/10; 714/746; 714/819
(58) Field of Classification Search .................. 714/10, 714/746, 819
See application file for complete search history.

(56) References Cited

U.S. PATENT DOCUMENTS 4,414,669 A * 11/1983 Heckelman et al. ........ 714/800

(Continued)

FOREIGN PATENT DOCUMENTS

EP        0 366 331        5/1990

(Continued)

OTHER PUBLICATIONS

N. Kanekawa et al, "Fault Detection and Recovery Coverage Improvement by Clock Synchronized Suplicated Systems with Optimal Time Diversity" *Fault-Tolerant Computing*, Jun. 1998, pp. 196-200.

(Continued)

*Primary Examiner*—Stephen M. Baker
(74) *Attorney, Agent, or Firm*—Nixon & Vanderhye P.C.

(57) ABSTRACT

An integrated circuit includes a plurality of processing stages each including processing logic 1014, a non-delayed signal-capture element 1016, a delayed signal-capture element 1018 and a comparator 1024. The non-delayed signal-capture element 1016 captures an output from the processing logic 1014 at a non-delayed capture time. At a later delayed capture time, the delayed signal-capture element 1018 also captures a value from the processing logic 1014. An error detection circuit 1026 and error correction circuit 1028 detect and correct random errors in the delayed value and supplies an error-checked delayed value to the comparator 1024. The comparator 1024 compares the error-checked delayed value and the non-delayed value and if they are not equal this indicates that the non-delayed value was captured too soon and should be replaced by the error-checked delayed value. The non-delayed value is passed to the subsequent processing stage immediately following its capture and accordingly error recovery mechanisms are used to suppress the erroneous processing which has occurred by the subsequent processing stages, such as gating the clock and allowing the correct signal values to propagate through the subsequent processing logic before restarting the clock. The operating parameters of the integrated circuit, such as the clock frequency, the operating voltage, the body biased voltage, temperature and the like are adjusted so as to maintain a finite non-zero error rate in a manner that increases overall performance.

54 Claims, 19 Drawing Sheets

U.S. PATENT DOCUMENTS

| | | | |
|---|---|---|---|
| 5,111,458 A * | 5/1992 | Hara | 714/45 |
| 5,203,003 A | 4/1993 | Donner | |
| 5,313,625 A | 5/1994 | Hess et al. | |
| 5,515,381 A * | 5/1996 | Chan | 714/758 |
| 5,553,232 A | 9/1996 | Wilhite et al. | |
| 5,615,263 A | 3/1997 | Takahashi | |
| 5,627,412 A | 5/1997 | Beard | |
| 6,188,610 B1 | 2/2001 | Kakizoe et al. | |
| 6,476,643 B1 | 11/2002 | Hugues et al. | |
| 6,708,284 B1 * | 3/2004 | Smith | 714/10 |
| 6,711,712 B1 * | 3/2004 | Quach | 714/819 |
| 7,043,679 B1 * | 5/2006 | Keltcher et al. | 714/763 |
| 7,055,060 B1 * | 5/2006 | Nguyen et al. | 714/11 |
| 2001/0016927 A1 | 8/2001 | Poisner | |
| 2004/0199821 A1 * | 10/2004 | Flautner et al. | 714/30 |
| 2004/0239397 A1 * | 12/2004 | Mudge et al. | 327/278 |
| 2005/0022094 A1 * | 1/2005 | Mudge et al. | 714/758 |

FOREIGN PATENT DOCUMENTS

| | | |
|---|---|---|
| EP | 0 374 420 | 6/1990 |
| EP | 0 653 708 | 5/1995 |
| JP | 60-20398 | 2/1985 |
| JP | 62-24498 | 2/1987 |
| SU | 809350 | 2/1981 |
| WO | WO 00/54410 | 9/2000 |
| WO | WO 01/46800 | 6/2001 |
| WO | WO 2004/084072 | 9/2004 |

OTHER PUBLICATIONS

"ARM710 Data Sheet" Dec. 1994, Advanced RISC Machines Ltd. (ARM).

* cited by examiner

SYSTEMATIC AND RANDOM ERROR DETECTION AND RECOVERY WITHIN PROCESSING STAGES OF AN INTEGRATED CIRCUIT

This application is a continuation-in-part of application Ser. No. 10/392,382, filed Mar. 20, 2003, the entire content of which is hereby incorporated by reference in this application.

BACKGROUND OF THE INVENTION

1. Field of the invention

This invention relates to the field of integrated circuits. More particularly, this invention relates to the detection of errors including both random errors and systematic errors and the recovery from such errors within processing stages of an integrated circuit.

2. Description of the Prior Art

It is known to provide integrated circuits that can be considered to be formed of a series of serially connected processing stages (e.g. a pipelined circuit). Between each of the stages is a signal-capture element such as a latch or a sense amp into which one or more signal values are stored. The processing logic of each processing stage is responsive to input values received from preceding processing stages or elsewhere to generate output signal values to be stored in an associated output latch. The time taken for the processing logic to complete its processing operations determines the speed at which the integrated circuit may operate. If the processing logic of all stages is able to complete its processing operation in a short period of time, then the signal values may be rapidly advanced through the output latches resulting in high speed processing. The system cannot advance signals between stages more rapidly than the slowest processing logic is able to perform its processing operation of receiving input signals and generating appropriate output signals. This limits the maximum performance of the system.

In some situations it is desired to process data as rapidly as possible and accordingly the processing stages will be driven so as to advance their processing operations at as rapid a rate as possible until the slowest of the processing stages is unable to keep pace. In other situations, the power consumption of the integrated circuit is more important than the processing rate and the operating voltage of the integrated circuit will be reduced so as to reduce power consumption up to the point at which the slowest of the processing stages is again no longer able to keep pace. Both of these situations in which the slowest of the processing stages is unable to keep pace will give rise to the occurrence of processing errors (i.e. systematic errors).

One way of avoiding the occurrence of processing errors is to drive the integrated circuit with processing clocks having a frequency known to be less than the minimum permissible by a tolerance range that takes account of worst case manufacturing variation between different integrated circuits, operating environment conditions, data dependencies of the signals being processed and the like. In the context of voltage level, it is normal to operate an integrated circuit at a voltage level which is sufficiently above a minimum voltage level to ensure that all processing stages will be able to keep pace taking account of worst case manufacturing variation, environmental conditions, data dependencies and the like. It will be appreciated that the conventional approach is cautious in restricting the maximum operating frequency and the minimum operating voltage to take account of the worst case situations.

Besides systematic processing errors that result from the slowest of the processing stages being able to keep pace when a processor is run at too high a frequency or too low an operating voltage, integrated circuits are also subject to random errors known as single event upsets (SEUs). An SEU is a random error (bit-flip) induced by an ionising particle such as a cosmic ray or a proton in a device. The change of state is transient i.e. pulse-like so a reset or rewriting of the device causes normal behaviour thereafter. It is known to use error correction codes to detect and correct random errors. However, such error correction techniques necessarily introduce delay as a result of the processing time required for error detection and correction. This processing delay is justifiable in environments such as noisy communication channels where error rates are high yet it is important to suppress errors in the processed received data to within a predetermined error rate. By way of contrast, in the case of integrated circuits where it is generally desired to process data as rapidly as possible, it is undesirable to introduce error correction to critical paths of the data processing operations due to the delay and associated negative performance impact that error correction circuitry incurs.

Viewed from one aspect the present invention provides an integrated circuit for performing data processing, said integrated circuit comprising:

a plurality of processing stages, a processing stage output signal from at least one processing stage being supplied as a processing stage input signal to a subsequent processing stage, wherein said at least one processing stage comprises:

processing logic operable to perform a processing operation upon at least one coded input value to generate a processing logic output signal, said coded input value being an input value to which an error correction code has been applied;

a non-delayed signal-capture element operable to capture a non-delayed value of said processing logic output signal at a non-delayed capture time, said non-delayed value being supplied to said subsequent processing stage as said processing stage output signal following said non-delayed capture time;

a delayed signal-capture element operable to capture a delayed value of said processing logic output signal at a delayed capture time later than said non-delayed capture time;

error correction logic operable to detect an occurrence of a random error in said delayed value of said processing logic output signal, to determine if said detected random error is correctable using said error correction code and to either generate an error-checked delayed value or to indicate that said detected random error is not correctable;

a comparator operable to compare said non-delayed value with said error-checked delayed value to detect a change in said processing logic output signal at a time following said non-delayed capture time, said change being indicative of a systematic error whereby said processing logic has not finished said processing operation at said non-delayed capture time or of a random error in said non-delayed value; and error-repair logic operable when said comparator detects said change in said processing logic output signal to perform an error-repair operation suppressing use of said non-delayed value either by replacing said non-delayed value by said error-checked delayed value in subsequent processing stages or by initiating repetition of said processing operation and processing operations of subsequent processing stages if said error correction logic indicates that said detected random error is not correctable.

The present technique recognises that the operation of the processing stages themselves can be directly monitored to find the limiting conditions in which they fail. When actual failures occur, then these failures can be corrected such that incorrect operation overall is not produced. The advantages achieved by the avoidance of excessively cautious performance margins in the previous approaches compared with the direct observation of the failure point in the present approach more than compensates for the additional time and power consumed in recovering the system when a failure does occur. Deliberately allowing such processing errors to occur such that critical paths fail to meet their timing requirements is highly counter-intuitive in this technical field where it is normal to take considerable efforts to ensure that all critical paths always do meet their timing requirements.

Furthermore, the invention recognises that random errors in the delayed value may be detected and corrected by error correction logic deployed off the critical path of the data processing operations. Thus, when no systematic processing errors are detected by the comparator, the error correction logic has no adverse impact on the rapid progress of the computation. However, in the event that a processing error is in fact detected by the comparator, the delayed value available for use by the error repair logic to ensure forward progress of the computation is a reliable value on which a random error check and, where appropriate, random-error correction has been performed. Regardless of the presence of the error correction logic in the path of the delayed signal value, when processing errors are detected by the comparator, there will be a delay in the processing due to the need to perform the error-repair operation. Thus there is a surprising synergy between the provision of delayed signal-capture elements that enable repair of deliberately induced systematic processing errors and the application of error correction coding to correct random errors in the delayed signal values. The error correction logic provides the advantage of improving the reliability of the delayed value by detecting and correcting random errors without significantly delaying progress of the computation.

It will be appreciated that the processing operation performed by the processing logic could be a non-trivial processing operation that results in the value of the input signal changing relative to the value of the output signal, for example where the processing operation is a multiplication operation or a division operation with non-trivial operands. However, according to one preferred arrangement the processing operation performed by the processing logic is an operation for which the processing logic output signal is substantially equal to the processing stage input value when no errors occur in said processing operation.

For example, according to a first preferred arrangement the data processing operation that does not ordinarily change the input value could be read or write operation performed by a memory circuit. According to an alternative preferred arrangement the at least one processing stage is performed by a register and said processing operation is a read, write or move operation. According to a further alternative preferred arrangement in which the output signal value should be equal to the input signal value, the at least one processing stage is performed by a multiplexer and the processing operation is a multiplexing operation.

Whilst the present technique is applicable to both synchronous and asynchronous data processing circuits, the invention is well-suited to synchronous data processing circuits in which the plurality of processing stages are respective pipeline stages within a synchronous pipeline.

It will be appreciated that a variety of different error correction codes could be used to error correction encode the input value input value, for example, linear block codes, convolutional codes or turbo codes. However, for arrangements in which the output value is substantially equal to the input value of the processing logic, it is preferred that the input value is error correction encoded using a Hamming code and the error repair logic performs said correction and said detection using said Hamming code. Hamming codes are simple to implement and suitable for detecting and correcting single bit errors such as those typically resulting from SEUs.

Although some preferred arrangements involve value-preserving processing operations such as read/write operations and data moving operations, in alternative preferred arrangements the processing operation performed by the processing logic is a value-altering operation for which the processing logic output signal can be different from said processing stage input value even when no errors occur in said processing operation. Thus the present technique is suitable for application to processing logic elements such as adders, multipliers and shifters.

In arrangements where the processing operation is a value-altering processing operation, it is preferred that the input value is error correction encoded using an arithmetic code comprising one of: an AN code, a residue code, an inverse residue code or a residue number code. Such arithmetic codes facilitate detection and correction of random errors in processing operations involving arithmetic operators.

It will be appreciated that the comparator alone could be relied upon to detect the presence of systematic errors. However, in preferred arrangements the integrated circuit comprises a meta-stability detector operable to detect meta-stability in the non-delayed value and trigger the error-repair logic to suppress the use of the non-delayed value if found to be meta-stable.

Having detected the occurrence of a systematic error, via the comparator, there are a variety of different ways in which this may be corrected or compensated. In one preferred type of embodiment the error-recovering logic is operable to replace the non-delayed value with the error-checked delayed value as the processing stage output signal. The replacement of the known defective processing stage output signal with the correct value taken from the error-checked delayed value sample is strongly preferred as it serves to ensure forward progress through the data processing operations even though errors are occurring and require compensation.

A preferred arrangement is one in which the error-repair logic operates to force the delay value to be stored in the non-delay latch in place of the non-delayed value.

Whilst the present technique is applicable to both synchronous and asynchronous data processing circuits, the invention is well suited to synchronous data processing circuits in which the processing operations within the processing stages are driven by a non-delayed clock signal.

In the context of systems in which the processing stages are driven by the non-delayed clock signal, the error-repair logic can utilise this to facilitate recovery from an error by gating the non-delayed clock signal to provide sufficient time for the following processing stage to recover from input of the incorrect non-delayed value and instead use the correct error-checked delayed value.

In the context of embodiments using a non-delayed clock signal, the capture times can be derived from predetermined phase points in the non-delayed clock signal and a delayed clock signal derived from the non-delayed clock signal. The delay between the non-delayed capture and the delayed capture can be defined by the phase shift between these two clock signals.

The detection and recovery from systematic errors can be used in a variety of different situations, but is particularly well suited to situations in which it is wished to dynamically control operating parameters of an integrated circuit in dependence upon the detection of such errors. Counter intuitively, the present technique can be used to control operating parameters such that the system operates with a non-zero systematic error rate being maintained as the target rate since this may correspond to an improved overall performance, either in terms of speed or power consumption, even taking into account the measures necessary to recover from occurrence of both systematic and random errors.

The operating parameters which may be varied include the operating voltage, an operating frequency an integrated circuit body biased voltage (which controls threshold levels) and temperature amongst others.

In order to ensure that the data captured in the delayed latch is always correct, an upper limit on the maximum delay in the processing logic of any stage is such that at no operating point can the delay of the processing logic of any stage exceed the sum of the clock period plus the amount by which the delayed capture is delayed. As a lower limit on any processing delay there is a requirement that the processing logic of any stage should have a processing time exceeding the time by which the delayed capture follows the non-delayed capture so as to ensure that following data propagated along short paths does not inappropriately corrupt the delayed capture value. This can be ensured by padding short paths with one or more delay elements as required.

The present technique is applicable to a wide variety of different types of integrated circuit, such as general digital processing circuits, but is particularly well suited to systems in which the processing stages are part of a data processor or microprocessor.

In order to facilitate the use of control algorithms for controlling the operational parameters preferred embodiments include an error counter circuit operable to store a count of the detection of errors corresponding to a change in the delayed value compared with the non-delayed value. This error counter may be reached by software to carry out control of the operational parameters.

It will be appreciated that the delayed signal-capture element and non-delayed signal-capture element discussed above could have a wide variety of different forms. In particular, these may be considered to include embodiments in the form of flip-flops, D-type latches, sequential elements, memory cells, register elements, sense amps, combinations thereof and a wide variety of other storage devices which are able to store a signal value.

Viewed from another aspect, the present invention provides a method of controlling an integrated circuit for performing data processing, said method comprising the steps of:

supplying a processing stage output signal from at least one processing stage of a plurality of processing stages as a processing stage input signal to a subsequent processing stage, said at least one processing stage operating to:

perform a processing operation with processing logic upon at least one coded input value to generate a processing logic output signal, said coded input value being an input value to which an error correction code has been applied;

capturing a non-delayed value of said processing logic output signal at a non-delayed capture time, said non-delayed value being supplied to said subsequent processing stage as said processing stage output signal following said non-delayed capture time;

capturing a delayed value of said processing logic output signal at a delayed capture time later than said non-delayed capture time;

detect an occurrence of a random error in said delayed value of said processing logic output signal using error correction logic, to determine if said detected random error is correctable using said error correction code and to either generate an error-checked delayed value or to indicate that said detected random error is not correctable;

comparing said non-delayed value with said error-checked delayed value to detect a change in said processing logic output signal at a time following said non-delayed capture time, said change being indicative of a systematic error whereby said processing logic has not finished said processing operation at said non-delayed capture time or of a random error in said non-delayed value; and when said change is detected, performing an error-repair operation using error-repair logic suppressing use of said non-delayed value either by replacing said non-delayed value by said error-checked delayed value in subsequent processing stages or by initiating repetition of said processing operation and processing operations of subsequent processing stages if said error correction logic indicates that said detected random error is not correctable.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
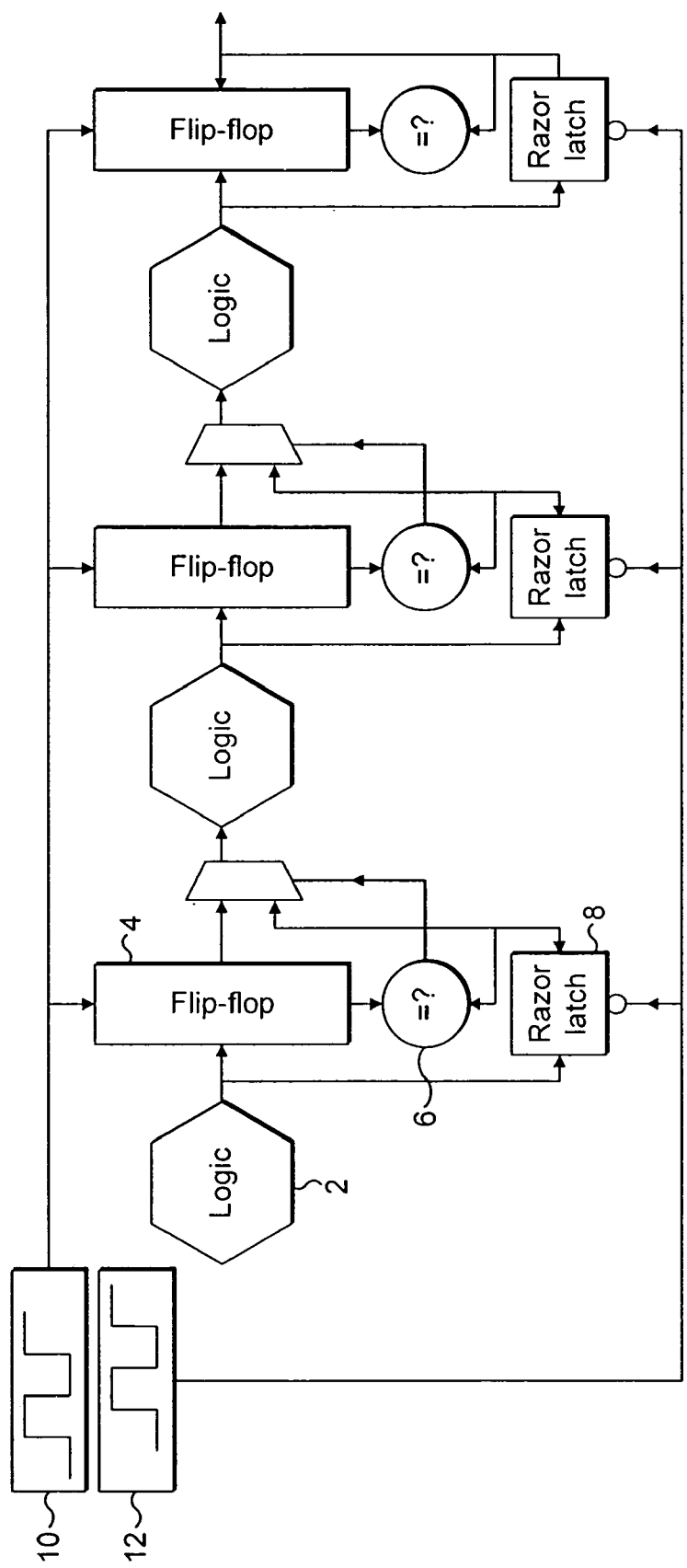
FIG. 1 schematically illustrates a plurality of processing stages to which the present technique is applied.

FIG. 1 illustrates a part of an integrated circuit, which may be a part of a synchronous pipeline within a processor core, such as an ARM processor core produced by ARM limited of Cambridge, England. The synchronous pipeline is formed of a plurality of like processing stages. The first stage comprises processing logic 2 followed by a non-delayed latch 4 in the form of a flip-flop together with a comparator 6 and a delayed latch 8. The term latch used herein encompasses any circuit element operable to store a signal value irrespective of triggering, clock and other requirements. Subsequent processing stages are similarly formed. A non-delayed clock signal 10 drives the processing logic and non-delayed latches 4 within all of the processing stages to operate synchronously as part of a synchronous pipeline. A delayed clock signal 12 is supplied to the delayed latches 8 of the respective processing stages. The delayed clock signal 12 is a phase shifted version of the non-delayed clock signal 10. The degree of phase shift controls the delay period between the capture of the output of the processing logic 2 by the non-delayed latch 4 and the capture of the output of the processing logic 2 at a later time performed by the delayed latch 8. If the processing logic 2 is operating within limits given the existing non-delayed clock signal frequency, the operating voltage being supplied to the integrated circuit, the body bias voltage, the temperature etc, then the processing logic 2 will have finished its processing operations by the time that the non-delayed latch 4 is triggered to capture its value. Consequently, when the delayed latch 8 later captures the output of the processing logic 2, this will have the same value as the value captured within the non-delayed latch 4. Accordingly, the comparator 6 will detect no change occurring during the delay period and error-recovery operation will not be triggered. Conversely, if the operating parameters for the integrated circuit are such that the processing logic 2 has not completed its processing operation by the time that the non-delayed latch 4 captures its value, then the delayed latch 8 will capture a different value and this will be detected by the comparator 6 thereby forcing an error-recovery operation to be performed. It will be seen that the error-recovery operation could be to replace the output of the non-delayed latch 4 which was being supplied to the following processing stage during the time following its capture with the delayed value stored within the delayed latch 8. This delayed value may additionally be forced to be stored within the non-delayed latch 4 replacing the previously erroneously captured value stored therein.

A meta-stability detector 7 serves to detect meta-stability in the output of the non-delayed latch 4, i.e. not at a clearly defined logic state. If such meta-stability is detected, then this is treated as an error and the value of the delay latch 6 is used instead.

On detection of an error, the whole pipeline may be stalled by gating the non-delayed clock signal 10 for an additional delayed period to give sufficient time for the processing logic in the following processing stage to properly respond to the corrected input signal value being supplied to it. Alternatively, it is possible that upstream processing stages may be stalled with subsequent processing stages being allowed to continue operation with a bubble inserted into the pipeline in accordance with standard pipeline processing techniques using a counterflow architecture (see the bubble and flush latches of FIG. 2). Another alternative is that the entire processing pipeline may be reset with the delayed latch values being forced into the non-delayed latches of each stage and processing resumed. The re-use of the delayed latch value in place of the erroneous value rather than an attempted recalculation ensures that forward progress is made through the processing operations even though an error has occurred.

There are constraints relating to the relationship between the processing time taken by the processing logic within the processing stages and the delay between the non-delayed capture time and the delayed capture time. In particular, the minimum processing time of any processing stage should not be less than the delay in order to ensure that the delayed value captured is not corrupted by new data being outputted from a short delay processing stage. It may be necessary to pad short delay processing stages with extra delay elements to ensure that they do not fall below this minimum processing time. At the other extreme, it needs to be ensured that the maximum processing delay of the processing logic within a processing stage that can occur at any operational point for any operating parameters is not greater than the sum of the normal non-delayed operating clock period and the delay value such that the delay value captured in the delay value latch is ensured to be stable and correct.

There are a number of alternative ways in which the system may be controlled to tune power consumption and performance. According to one arrangement an error counter circuit (not illustrated) is provided to count the number of non-equal detections made by the comparator 6. This count of errors detected and recovered from can be used to control the operating parameters using either hardware implemented or software implemented algorithms. The counter is readable by the software. The best overall performance, whether in terms of maximum speed or lowest power consumption can be achieved by deliberately operating the integrated circuit with parameters that maintain a non-zero level of errors. The gain from operating non-cautious operating parameters in such circumstances exceeds the penalty incurred by the need to recover from errors.

According to an alternative arrangement, a hardware counter is provided as a performance monitoring module and is operable to keep track of useful work and of error recovery work. In particular, the counter keeps count of the number of useful instructions used to progress the processing operations being executed and also keeps count of the number of instructions and bubbles executed to perform error recovery. The software is operable to read the hardware counter and to use the count values to appropriately balance the overhead of error recovery and its effects on system performance against the reduced power consumption achieved by running the integrated circuit at a non-zero error rate.

Figure 2:
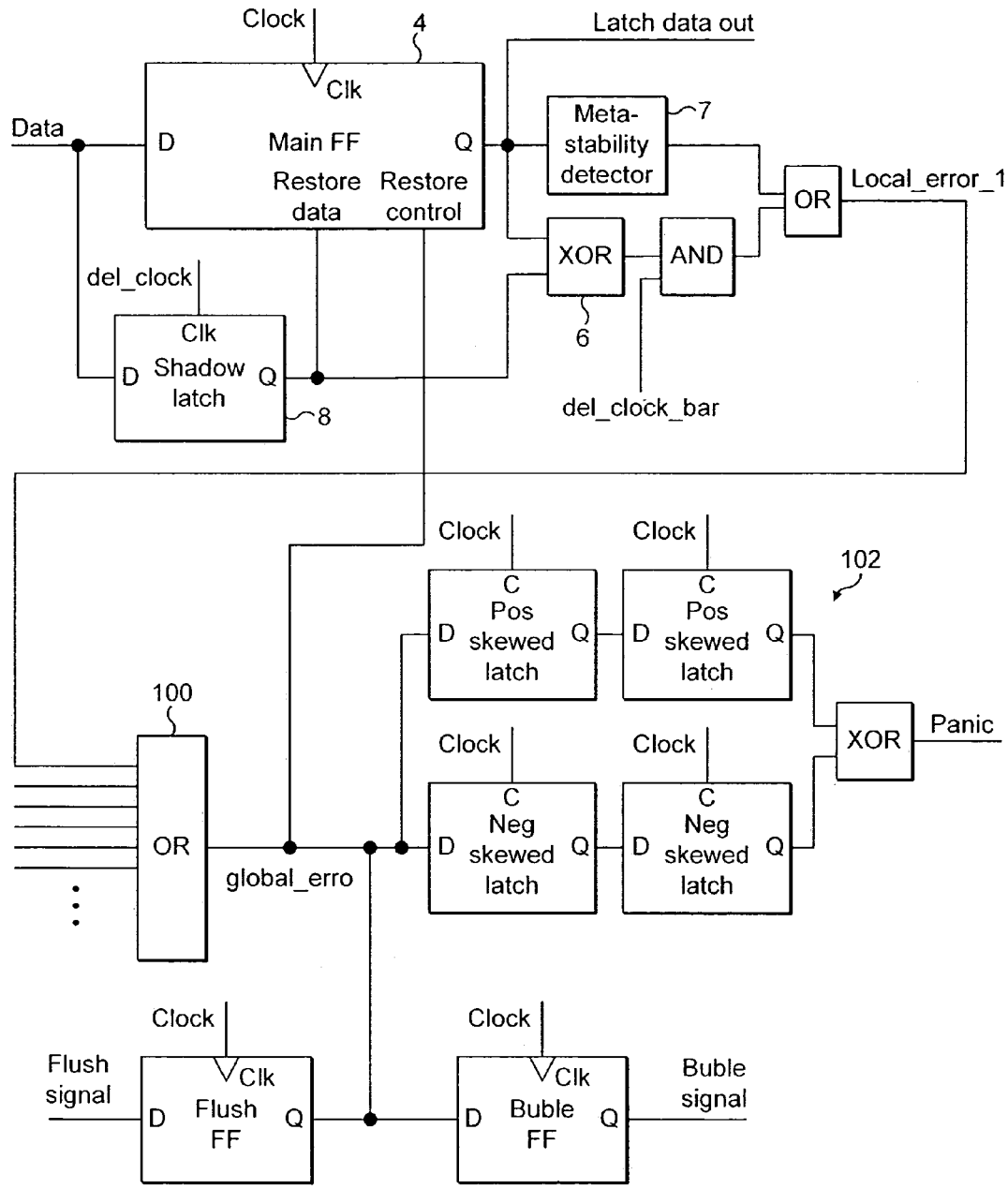
FIG. 2 is a circuit block diagram schematically illustrating a circuit for use in the present technique.

FIG. 2 is a circuit block diagram schematically illustrating a circuit for use in the present technique. The top portion of FIG. 2 illustrates circuit elements provided within each processing stage, namely the non-delayed latch 4, the delayed latch 8 and the comparator 6. A meta-stability detector 7 serves to detect meta-stability in the output of the non-delayed latch 4 and this also triggers generation of an error signal. Error signals from a plurality of such stages are supplied to respective inputs of an OR gate 100 where a global error signal is generated if an error is detected in any processor stage. The global error signal can be used to trigger flush and bubble insertion signals as illustrated. The circuits 102 detect whether the error signal itself is meta-stable. The error signal is latched with a positively skewed latch, referencing at a higher voltage and a negatively skewed latch, referencing at a lower voltage. If the two disagree in their latched value, this indicates that the error signal was meta-stable and the panic signal is pulled. By latching the error signal and waiting for an entire clock cycle before it sampled (i.e. two latches in series), the probability of the panic signal being meta-stable is negligible. It is significant that if the panic signal is pulled, then the restored value from the delayed latch could be corrupted due to the meta-stability of the error signal. In this case, the instruction is also invalidated and there is no forward progress. Hence flush the pipeline restart the instruction and lower the clock frequency to ensure that the error signal will not be meta-stable on the retry of the same instruction (which could otherwise cause an infinite loop of retries).

Figure 3:
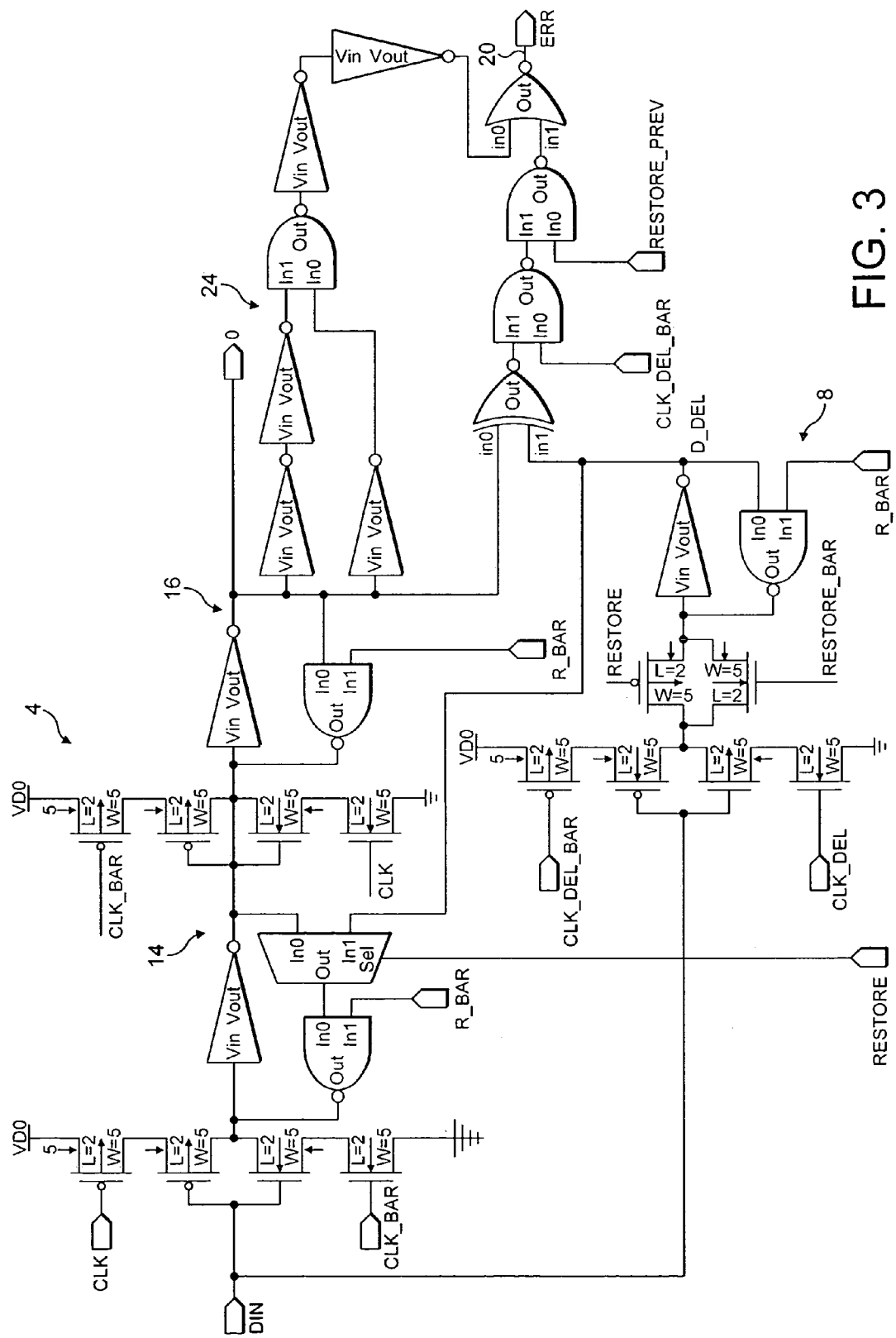
FIG. 3 is a circuit diagram schematically illustrating a non-delayed latch and a delayed latch together with an associated comparator and error-recovery logic.

FIG. 3 is a circuit illustrating in more detail the non-delayed latch, the delayed latch, the comparator and at least part of the error-recovery circuitry. The non-delayed latch 4 can be seen to be in the form of a flip-flop provided by the two latches 14, 16. The delayed latch 8 is in the form of a single feedback element. An XOR gate 18 serves as the comparator. An error signal 20 emerges from the circuit of FIG. 3 and may be supplied to the error counter circuit as previously discussed or to other operational parameter adjusting circuits or systems. The error signal 20 serves to switch a multiplexer 22 that forces the delayed value stored within the delayed latch 8 to be stored within the latch 14 of the non-delayed latch 4. meta-stability detecting circuits 24 serve to detect the occurrence of meta-stability within the non-delayed latch 4 and also use this to trigger an error signal which will cause the erroneous meta-stable value to be replaced by the delayed value stored within the delayed latch 8.

Figure 4A:
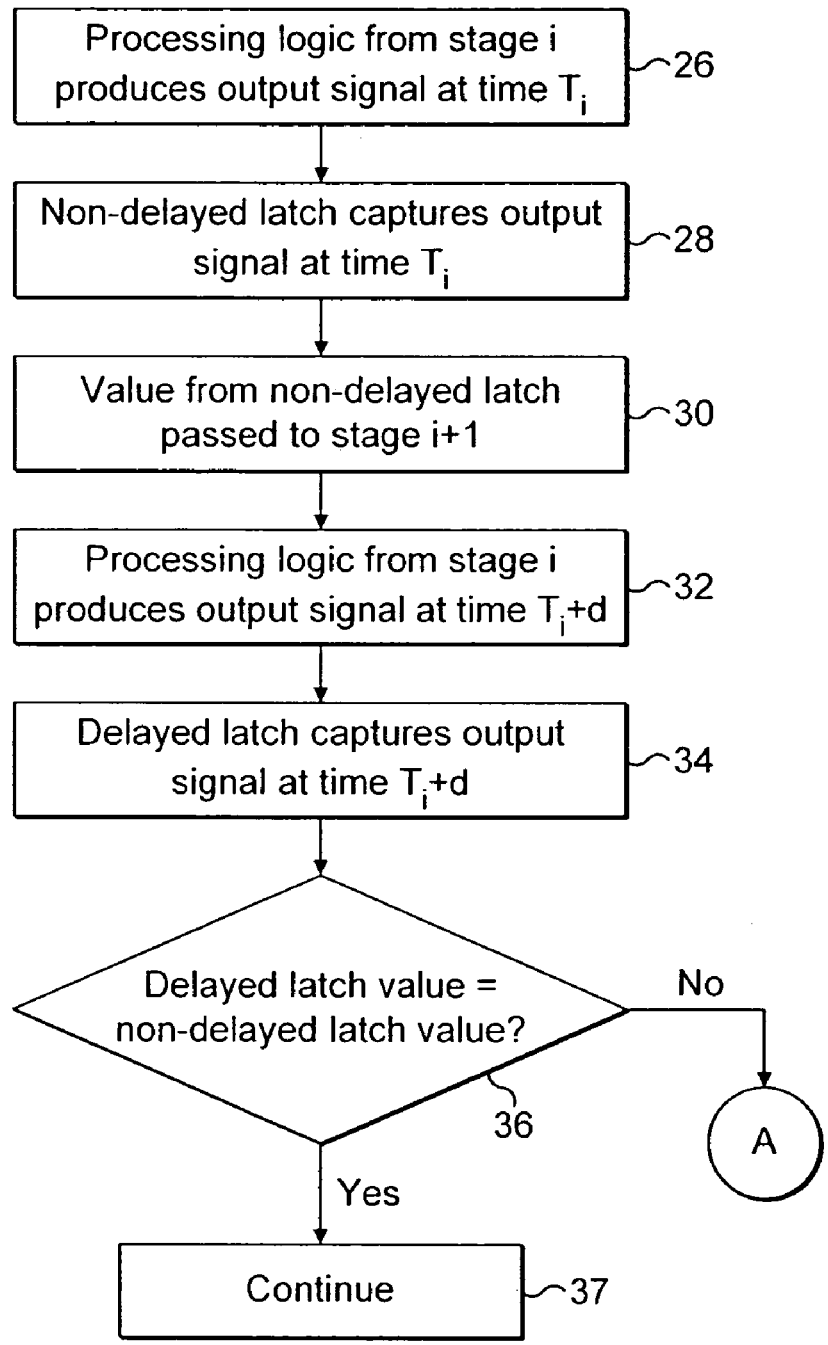
FIGS. 4A and 4B are a flow diagram schematically illustrating the operation of the circuit of FIG. 1.
Figure 4B:
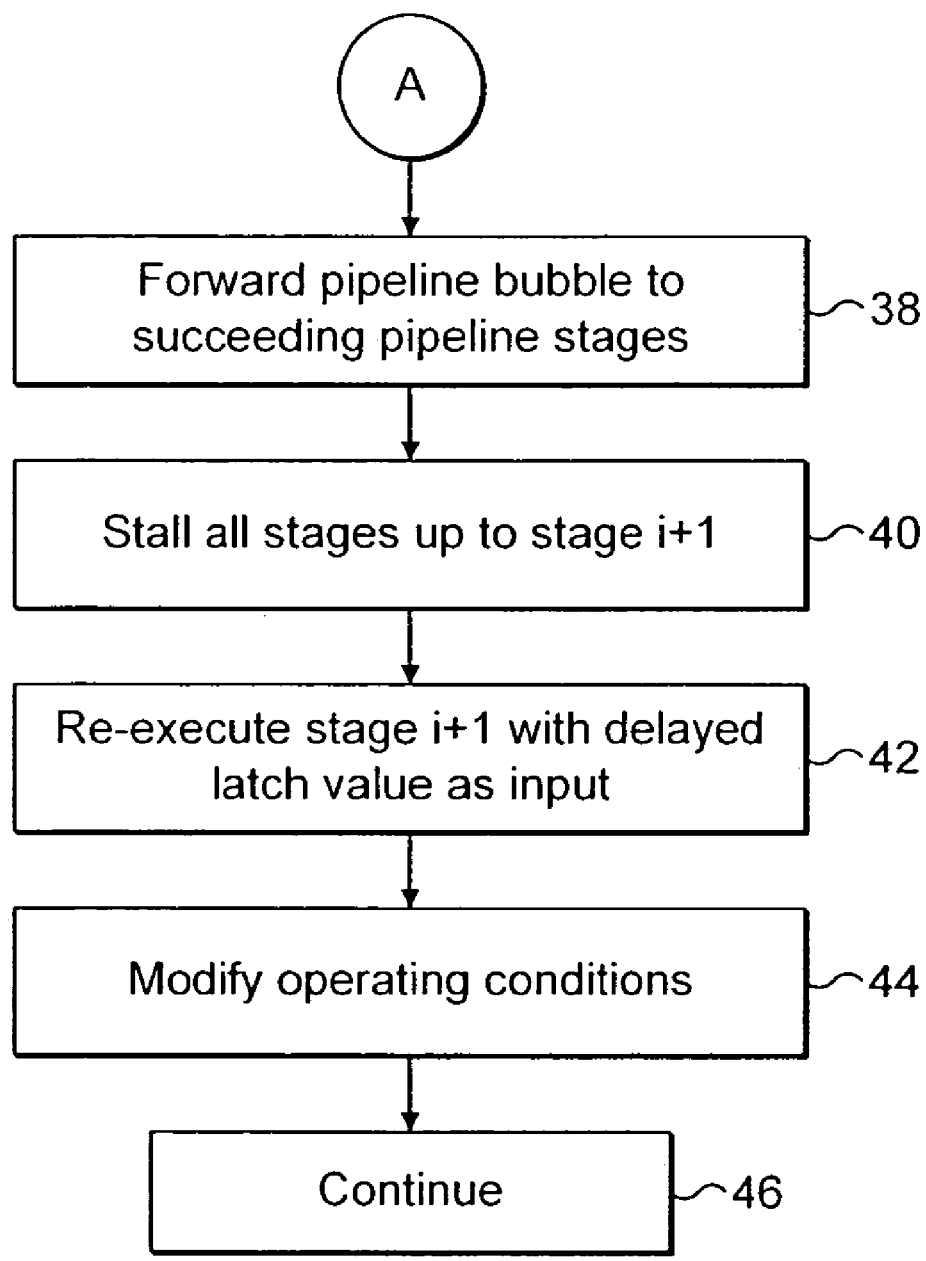

FIGS. 4A and 4B are a flow diagram schematically illustrating the operation of the circuits of FIGS. 1, 2 and 3.

At step 26 the processing logic from a stage i produces its output signal at a time $T_i$. At step 28 this is captured by the non-delayed latch and forms the non-delayed value. At step 30 the non-delayed value from the non-delayed latch starts to be passed to the following processing stage i+1 which commences processing based upon this value. This processing may turn out to be erroneous and will need recovering from should an error be detected.

Step 32 allows the processing logic to continue processing for a further time period, the delay time, to produce an output signal at time Ti+d. This output signal is latched in the delayed latch at step 34. The values within the delayed latch and the non-delayed latch are compared at step 36. If they are equal then no error has occurred and normal processing continues at step 37. If they are not equal, then this indicates that the processing logic at time $T_i$ had not completed its processing operations when the non-delayed latch captured its value and started to supply that value to the subsequent processing stage i+1. Thus, an error condition has arisen and will require correction. At step 38 this correction is started by the forwarding of a pipeline bubble into the pipeline stages following stage i. At step 40 the preceding stages to stage i+1 are all stalled. This includes the stage i at which the error occurred. At step 42, stage i+1 re-executes its operation using the delayed latch value as its input. At step 44 the operating parameters of the integrated circuit may be modified as required. As an example, the operating frequency may be reduced, the operating voltage increased, the body biased voltage increased etc. Processing then continues to step 46.

If an insufficient number of errors is detected, then the operating parameter controlling circuits and algorithms can deliberately adjust the operating parameters so as to reduce power consumption and to provoke a non-zero error rate.

Figure 5:
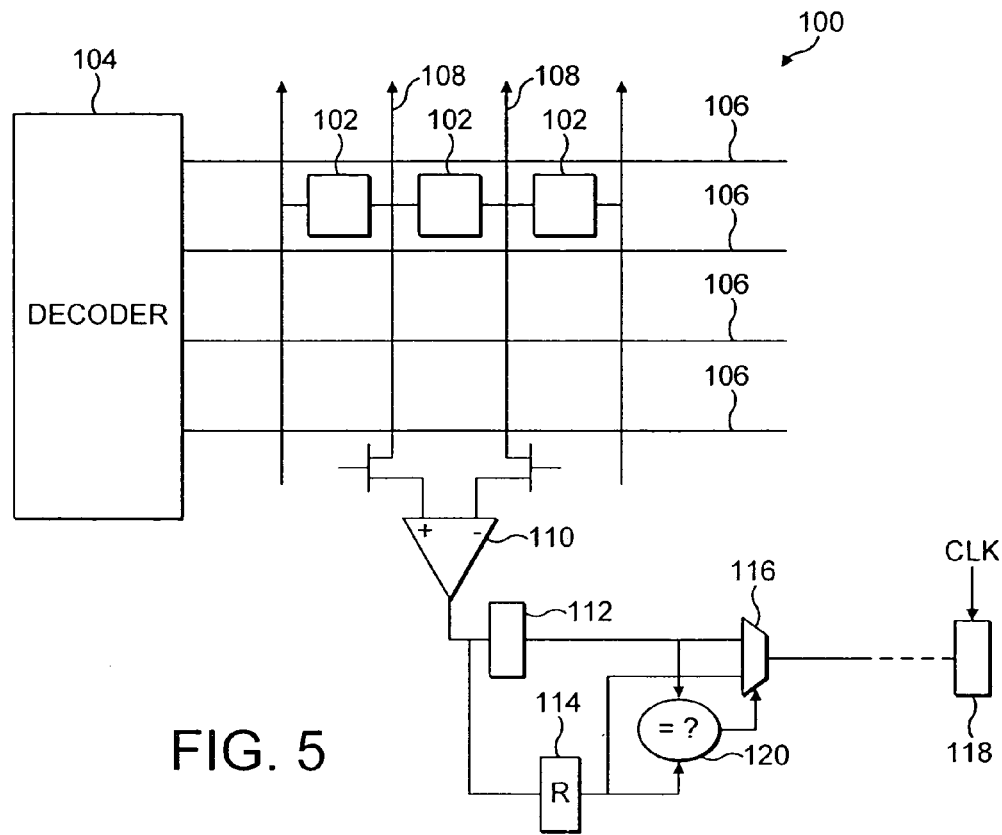
FIG. 5 schematically illustrates a memory circuit including a fast read mechanism and a slow read mechanism.

FIG. 5 illustrates a memory 100 containing an array of memory cells 102. In this example, a single row of memory cells is illustrated, but as will be familiar to those in this technical field such memory cell arrays are typically large two-dimensional arrays containing many thousands of memory cells. In accordance with normal memory operation, a decoder 104 serves to receive a memory address to be accessed and to decode this memory address so as to activate one of the word lines 106. The word lines serve to couple the memory cells 102 in that line to respective bit line pairs 108. Depending upon the bit value stored within the memory cell 102 concerned this will induce an electrical change (e.g. a change in voltage and/or a current flow) in the bit lines 108 now coupled to it and the change is sensed by a sense amplifier 110. The output of the sense amplifier 110 is stored at a first time within a non-delayed latch 112 and subsequently stored at a delayed time within a delayed latch 114. The non-delayed value stored within the non-delayed latch 112 is directly passed out via a mutliplexer 116 to a further processing circuit 118 before the delayed value has been stored into the delayed latch 114. When the delayed value has been captured within the delayed latch 114, a comparator 120 serves to compare the non-delayed value and the delayed value. If these are not equal, then the delayed value is switched by the multiplexer 116 to being the output value from the memory 100 for the particular bit concerned. A suppression signal is also issued from the comparator 120 to the further processing circuit 118 to suppress processing by that further processing circuit 118 based upon the erroneous non-delayed value which has now been replaced. This suppression in this example takes the form of controlling the clock signal CLK supplied to the further processing circuit 118 to stretch the clock cycle concerned and to delay latching of the new result by that further processing circuit until a time when the delayed value has had a chance to propagate through the processing circuit concerned to reach the latch at the output of that further processing circuit.

It will be seen that the sense amplifier 110 and the non-delayed latch 112 form part of the fast read mechanism. The sense amplifier 110 and the delayed latch 114 form part of the slow read mechanism. In most cases, the fast read result latched within the non-delayed latch 112 will be correct and no corrective action is necessary. In a small number of cases, the fast read result will differ from the slow read result latched within the delayed latch 114 and in this circumstance the slow read result is considered correct and serves to replace the fast read result with processing based upon that fast read result being suppressed. The penalty associated with a relatively infrequent need to correct erroneous fast read results is more than compensated for by the increased performance (in terms of speed, lower voltage operation, lower energy consumption and/or other performance parameters) that is achieved by running the memory 100 closer to its limiting conditions.

Figure 6:
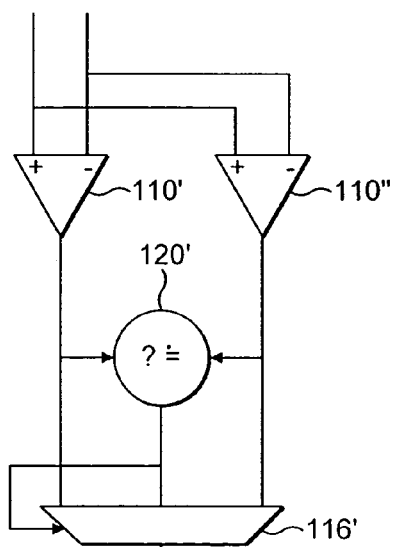
FIG. 6 illustrates an alternative circuit arrangement for a portion of the circuit of FIG. 5.

FIG. 6 illustrates a variation in part of the circuit of FIG. 5. In this variation two sense amplifiers 110', 110" are provided. These different sense amplifiers 110', 110" are formed to have different speeds of operation with one 110' being relatively fast and less reliable and the other 110" being relatively slow and more reliable. These different characteristics can be achieved by varying parameters of the sense amplifier 110', 110", e.g. construction parameters such as transistor size, doping levels, gain etc. A comparator 120' serves to compare the two outputs. The output from the fast sense amplifier 110' is normally passed out via the multiplexer 116' prior to the output of the slow sense amplifier 110" being available. When the output of the slow sense amplifier 110" is available and the comparator 120 detects this is not equal to the output of the fast sense amplifier 110', then it controls the multiplexer 116' to switch the output value to be that generated by the slow sense amplifier 110". The comparator 120 also triggers generation of a suppression signal such that downstream processing based upon the erroneous fast read result is suppressed.

Figure 7:
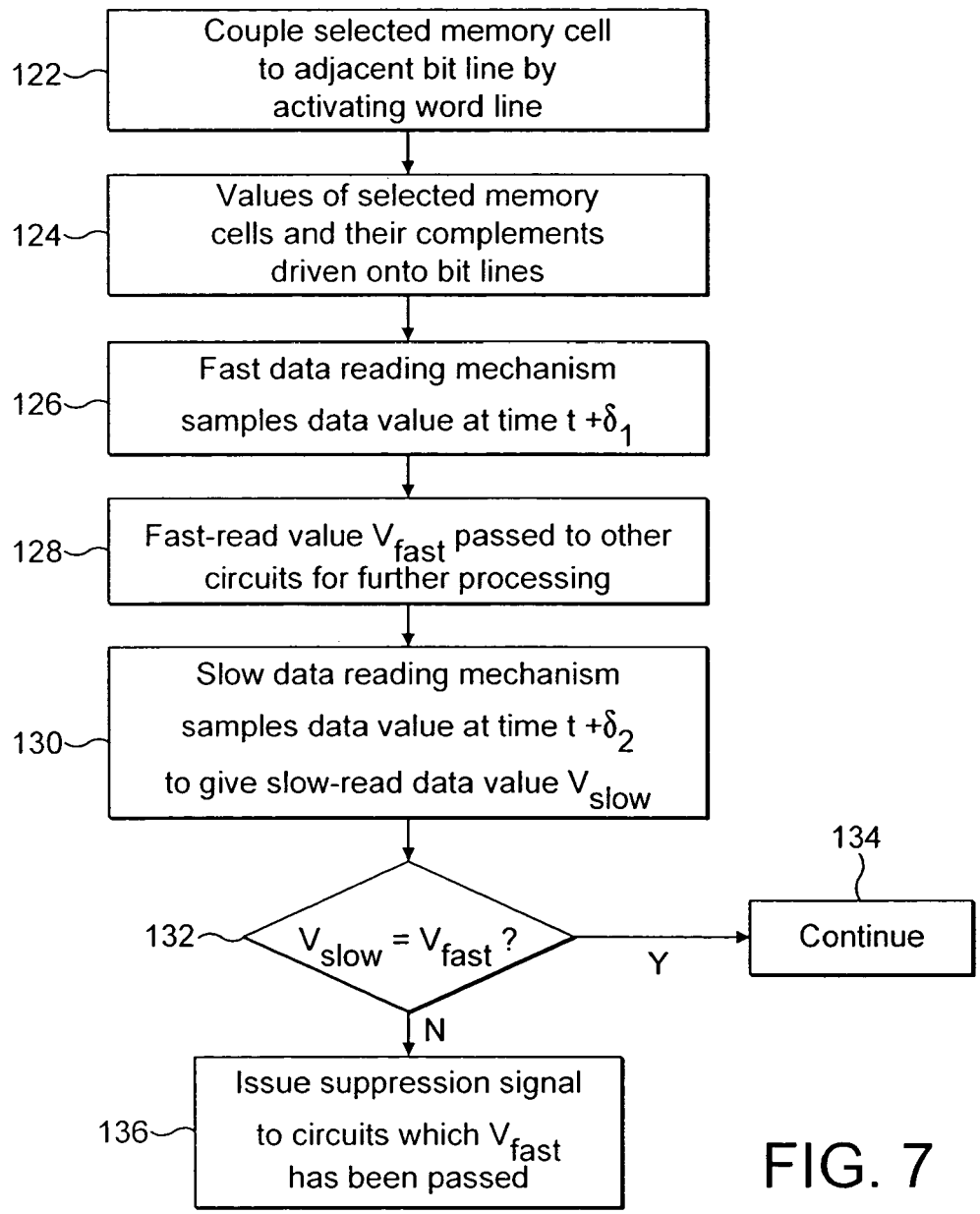
FIG. 7 is a flow diagram schematically illustrating the operation of the memory circuit of FIG. 5.

FIG. 7 is a flow diagram illustrating the operation of the circuit of FIG. 5. At step 122, an address is decoded resulting in respective memory cells being coupled to their adjacent bit lines using a signal passed by a word line. At step 124, the bit values stored within the selected memory cells and their complements and driven onto the bit line pairs. This causes current flows within the bit lines and voltage changes in the bit lines. The sense amplifiers 110 are responsive to detected currents and/or voltage level changes.

At step 126, the fast data read mechanism samples the value being output from the memory cell at that time. At step 128 this fast read data value is passed to subsequent processing circuits for further processing upon the assumption that it is correct. At step 130, the slow data reading mechanism samples a slow read data value. Step 132 compares the fast read value and the slow read value. If these are the same, then normal processing continues at step 134. However, if the sampled values are different, then step 136 serves to issue a suppression signal to the further circuits to which the fast read value has been passed and also to issue the slow read value in place of the fast read value to those further circuits such that corrective processing may take place.

Figure 8:
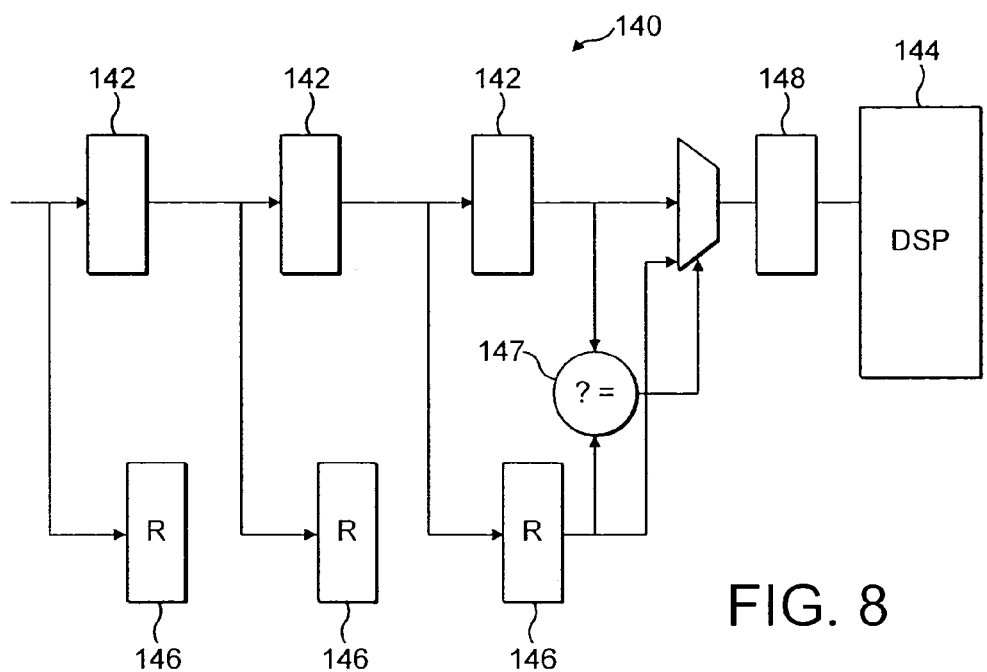
FIG. 8 illustrates a pipelined bus including non-delayed latches and delayed latches between the bus stages.

FIG. 8 illustrates the use of the present techniques within a pipelined bus 140. The pipelined bus 140 contains a number of latches 142 which serve to store data values being passed along the bus. As an example of such a pipelined bus 140 there is known the AXI buses designed by ARM Limited of Cambridge, England. In this arrangement the destination for the data value being passed along the pipelined bus 140 is a digital signal processing circuit 144. This digital signal processing (DSP) circuit 144 does not in itself implement the non-delayed latching and delayed latching techniques discussed previously. In alternative arrangements the destination for the data value being passed along the pipelined bus could be a device other than a DSP circuit, for example, a standard ARM processor core that does; not itself implement the delayed and non-delayed latching techniques.

Associated with each of the non-delayed latches 142 is a respective delayed latch 146. These delayed latches 146 serve to sample the signal value on the bus at a time later than when this was sampled and latched by the non-delayed latch 142 to which they correspond. Thus, a delay in the data value being passed along the bus for whatever reason (e.g. too low an operational voltage being used, the clock speed being too high, coupling effects from adjacent data values, etc) will result in the possibility of a difference occurring between the values stored within the non-delayed latch 142 and the delayed latch 146. The final stage on the pipeline bus 140 is illustrated as including a comparator 147 which compares the non-delayed value and the delayed value. If these are not equal, then the delayed value is used to replace the non-delayed value and the processing based upon the non-delayed value is suppressed such that the correction can take effect (the bus clock cycle may be stretched). It will be appreciated that these comparator and multiplexing circuit elements will be provided at each of the latch stages along the pipeline bus 140, but these have been omitted for the sake of clarity from FIG. 8.

As the DSP circuit 144 does not itself support the non-delayed and delayed latching mechanism with its associated correction possibilities, it is important that the data value which is supplied to the DSP circuit 144 has been subject to any necessary correction. For this reason, an additional buffering latch stage 148 is provided at the end of the pipelined bus 140 such that any correction required to the data value being supplied to that latch and the attached DSP circuit 144 can be performed before that data value is acted upon by the DSP circuit 144. The buffering latch 148 can be placed in sufficient proximity to the DSP circuit 144 that there will be no issue of an insufficient available progation time etc. causing an error in the data value being passed from the buffering latch 148 to the DSP circuit 144.

It will be appreciated that the bus connections between the respective non-delayed latches 142 can be considered to be a form of processing logic that merely passes the data unaltered. In this way, the equivalence between the pipelined bus embodiment of FIG. 8 and the previously described embodiments (e.g. FIG. 1) will be apparent to those familiar with this technical field.

Figure 9:
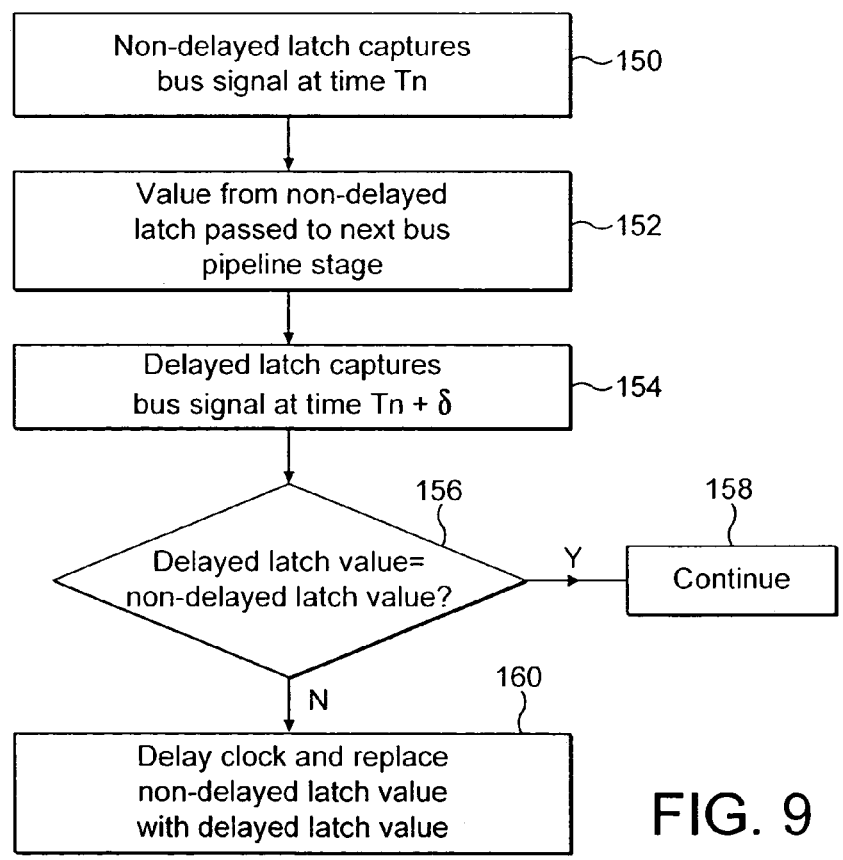
FIG. 9 is a flow diagram schematically illustrating the operation of the pipelined bus of FIG. 8.

FIG. 9 is a flow diagram illustrating the operation of FIG. 8. At stage 150 a non-delayed signal value is captured from the bus line. At step 152 the non-delayed value is then passed to the next bus pipeline stage. At step 154 the corresponding delayed latch 146 captures a delayed bus signal. At step 156 the comparator 147 compares the delayed value with the non-delayed value. If these are equal, then normal processing continues at step 158. If the two compared values are not equal, then step 160 serves to delay the bus clock and replace the non-delayed value with the delayed value using the multiplexer shown in FIG. 8.

Figure 10:
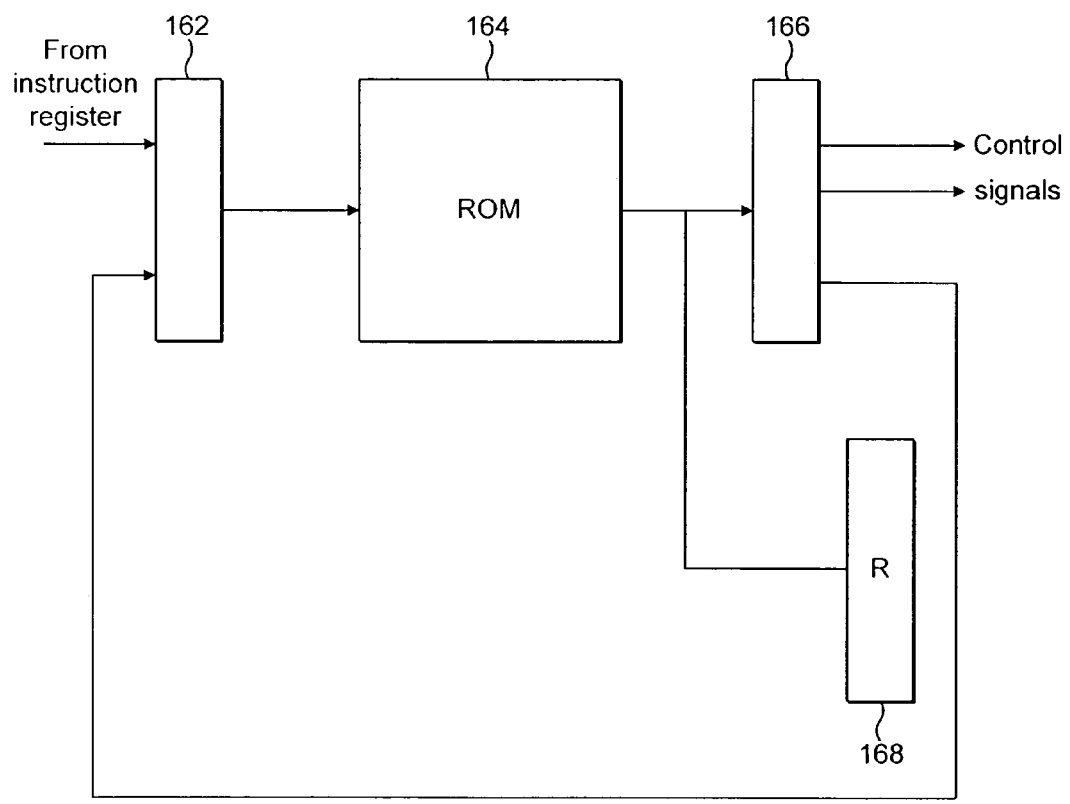
FIG. 10 schematically illustrates the generation of control signals for controlling a microprocessor that are subject to both non-delayed latching and output and delayed latching and output.

FIG. 10 illustrates a further example embodiment using the present techniques. In this example embodiment an instruction from an instruction register within a processor core is latched within an instruction latch 162. From this instruction latch 162, the instruction is passed to a decoder 164 which includes a microcoded ROM serving to generate an appropriate collection of processor control signals for storage in a non-delayed control signal latch 166 and subsequent use to control the processing performed by the processor core in accordance with the instruction latched within the instruction latch 162. The control signals output from the decoder 164 are also latched within a delayed control signal latch 168 at a later time to when they were latched within the non-delayed control signal latch 166. The delayed control signal values and the non-delayed control signal values can then be compared. If these are not equal, then this indicates that corrective action is necessary. A suppression operation is triggered by the detection of such a difference and serves to stop subsequent processing based upon the inappropriate latch control signal values. It may be that in some circumstances the only effective recovery option is to reset the processor as a whole. This may be acceptable. In other situations, the error in the control signals might be such that a less drastic suppression and recovery mechanism is possible. As an example, the particular erroneous control signal may not yet have been acted upon, e.g. in the case of a multi-cycle program instruction where some processing operations do not commence until late in the overall execution of the multi-cycle instruction. An example of this is a multiply-accumulate operation in which the multiply portion takes several clock cycles before the final accumulate takes place. If there is an error in the control signal associated with the accumulate and in practice an accumulate is not required, but merely a pure multiply, then it would be possible to suppress the accumulate by correcting the control signal being applied to the accumulator before the adder had sought to perform the accumulate operation.

Figure 11:
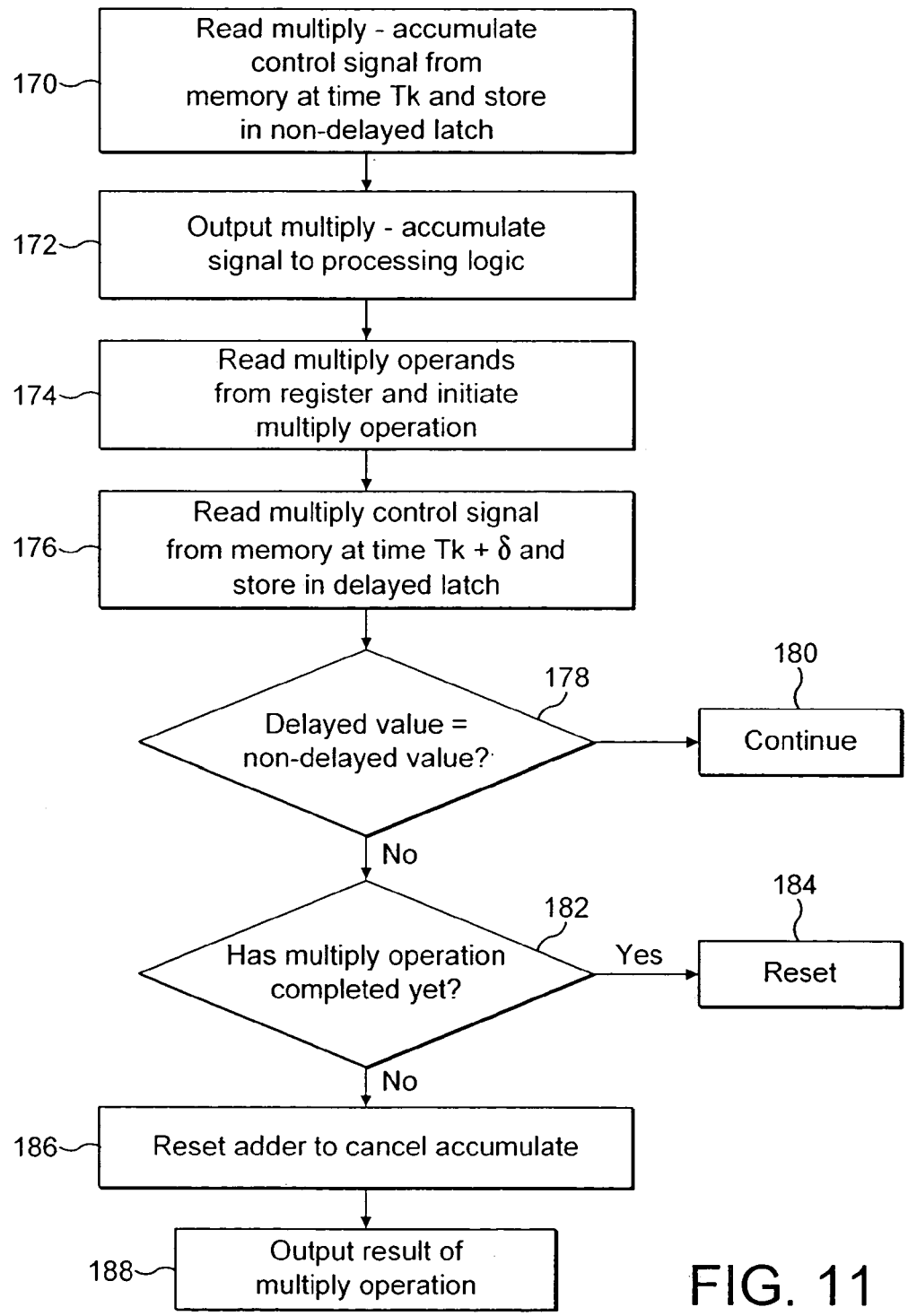
FIG. 11 is a flow diagram schematically illustrating one example of the operation of the circuit of FIG. 10.

FIG. 11 illustrates one example of the operation of the circuit of FIG. 10. At step 170, a multiply-accumulate control signal is read from the decoder 164 (microcoded ROM). At step 172, this multiply-accumulate control signal is latched within the non-delayed control signal latch 166 and output to the various processing elements within the processor core. At step 174, the multiply operands are read from the register file and the multiply operation is initiated. At step 176, the control signals output by the instruction decoder 164 are re-sampled by the delayed control signal latch 168. At step 178, the non-delayed control signals and the delayed control signals are compared. If these are equal, then normal processing continues at step 180. However, if these are not equal, then processing proceeds to step 182 where a determination is made as to whether the multiply operation has yet completed. If the multiply operation has completed, then the erroneous accumulate operation will have started and the best option for recovery is to reset the system as a whole at step 184. However, if the multiply operation is still in progress, then step 186 can be used to reset the adder and cancel the accumulate operation with the desired multiply operation output result being generated at step 188, as was originally intended by the program instruction stored within the instruction latch 162.

Figure 12:
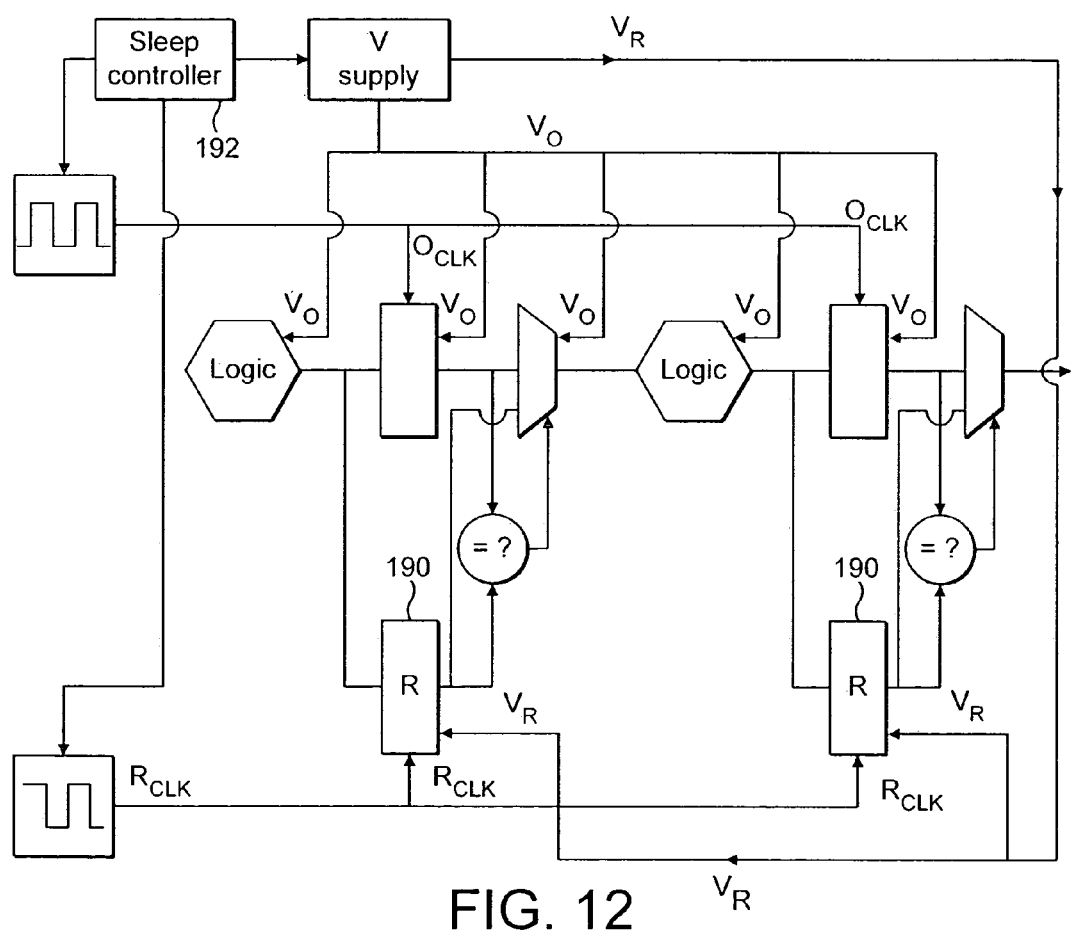
FIG. 12 illustrates a processing pipeline including non-delayed latches and delayed latches with those delayed latches being reused as data retention latches during a lower power of operation.

FIG. 12 illustrates a modification of the circuit illustrated in FIG. 1. In this embodiment the delayed latches 190 serve the additional function of data retention (balloon) latches for use during a standby/sleep mode of operation (low power consumption mode). The function of the delayed latches 190 during normal processing operations is as previously described. However, when a sleep controller 192 serves to initiate entry into a low power consumption mode of operation it stops the non-delayed clock and the delayed clock such that the delayed latches 190 are all storing data values corresponding to their respective non-delayed latches. At this point, the voltage supply to the non-delayed latches and the associated processing circuits is removed such that they are powered down and lose their state. However, the voltage supplied to the non-delayed latches 190 is maintained such that they serve to retain the state of the processing circuit concerned. When the system exits from the low power consumption mode, the processing logic and the non-delayed latches are powered up again when the comparator detects a difference in the values in the non-delayed latch and the delayed latch 190 it triggers replacement of the erroneous value within the non-delayed latch with the correct value held within the associated delayed latch 190. It will be appreciated that since the delayed latches 190 are subject to less stringent timing requirements than their non-delayed counterparts they can be formed in a way where they may have a lower speed of operation but be better suited to low power consumption during the low power consumption mode (e.g. high threshold voltages resulting in slower switching but with a reduced leakage current). In this way, the error correcting delayed latches which are used during normal processing can be reused during the low power consumption mode as data retention latches thereby advantageously reducing the overall gate count of the circuit concerned.

Figure 13:
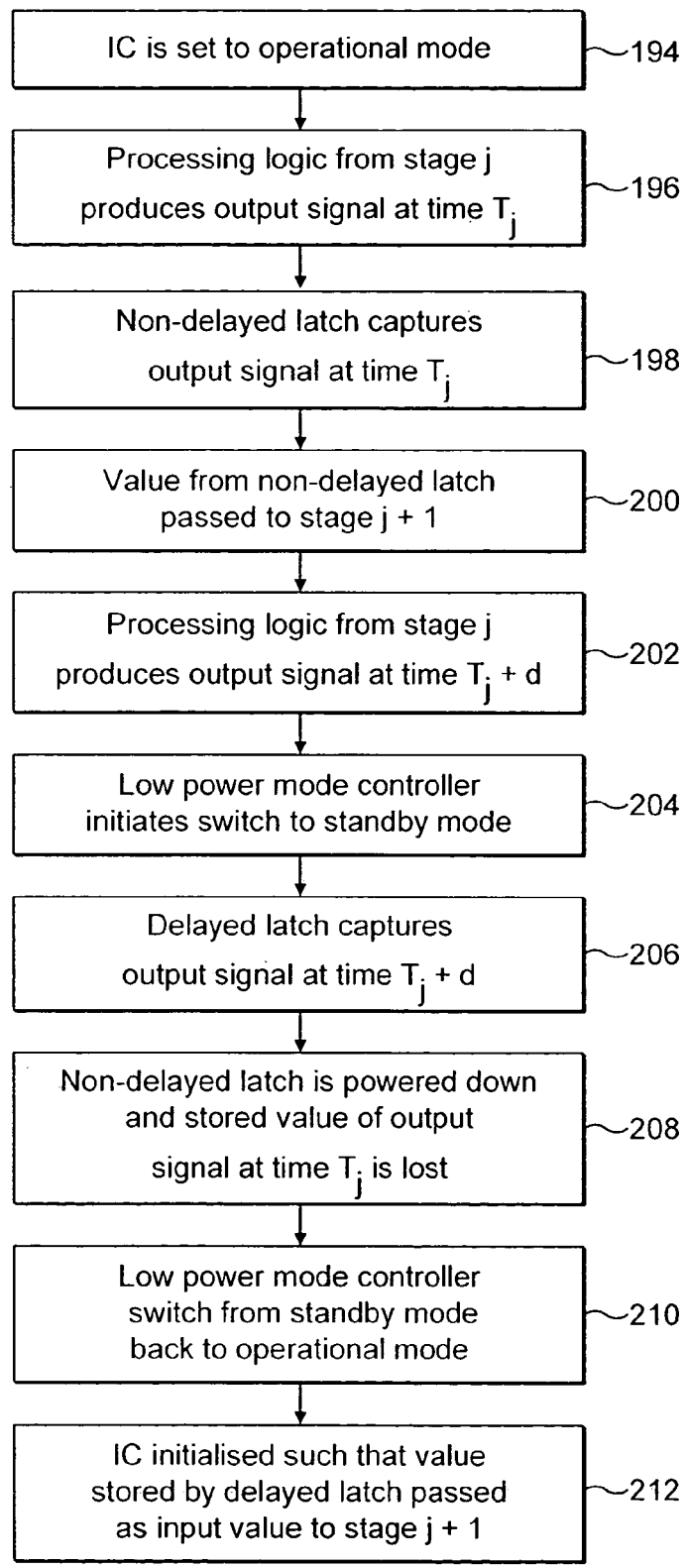
FIG. 13 is a flow diagram schematically illustrating the operation of the circuit of FIG. 12.

FIG. 13 is a flow diagram schematically illustrating the operation of the circuit of FIG. 12. At step 194, the integrated circuit is in its normal operational processing mode. At step 196, the processing logic stage produces an output signal at a non-delayed time. At step 198, the non-delayed latch captures that output signal. At step 200 the non-delayed signal within the non-delayed latch is passed to the next processing stage. At step 202, the output from the processing stage at a delayed time is generated and is available for capture by the delayed latch. At step 204, the integrated circuit is triggered to adopt a low power consumption mode and the speed controller 192 serves to initiate the power down of the processing circuits while maintaining the power to the delayed latches 190. At step 206, the delayed latch 190 captures the delayed signal value. It may be that the capture of the delayed signal value by the delayed latch at step 206 takes place before the switch to the low power mode at step 204. At step 208, the non-delayed latch is powered down and its stored value is lost. The integrated circuit can remain in this state for a long period of time. When desired, step 210 triggers the sleep controller 192 to exit the low power consumption mode and revert back to the operational mode. At step 212, power is restored to the non-delayed latches and the associated processing logic with the delayed data values within the delayed latches 190 being used to repopulate the pipeline stages as necessary to restore the system to its condition prior to the low power consumption mode being entered.

Figure 14:
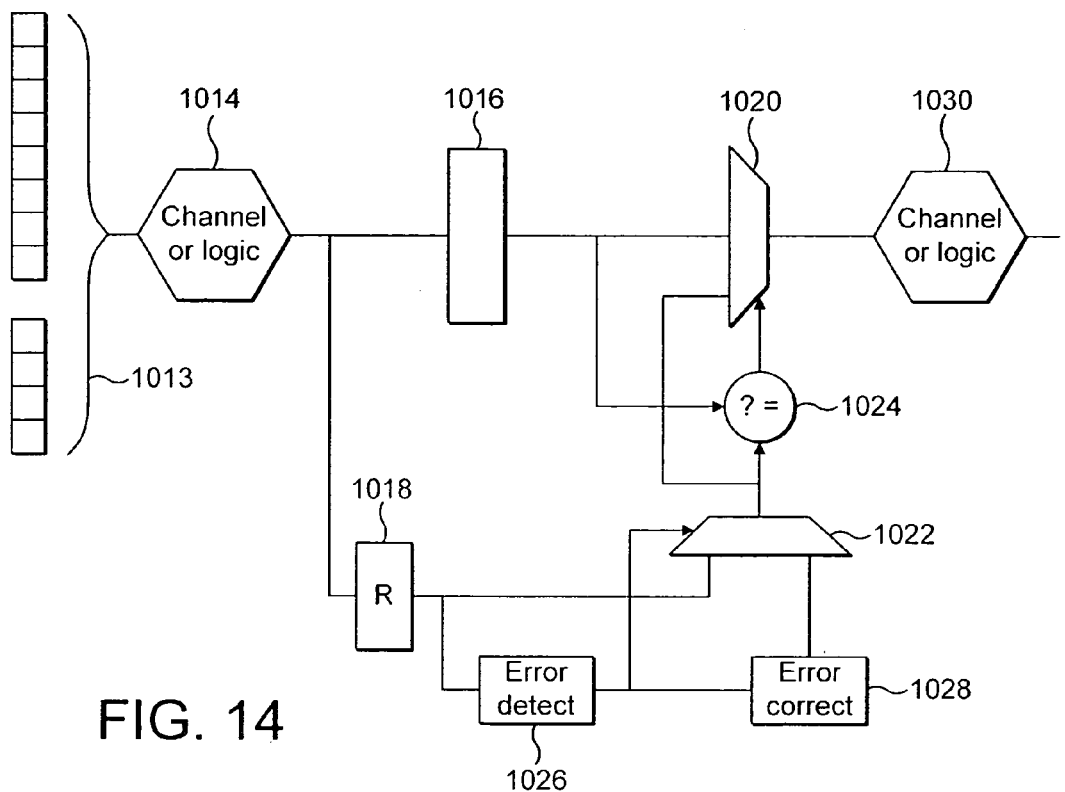
FIG. 14 schematically illustrates a plurality of processing stages to which error correction and delayed latches have been applied.

FIG. 14 schematically illustrates a plurality of processing stages to which error correction control and delayed latches have been applied. The processing stages form part of an integrated circuit that may be part of a synchronous pipeline within a processor core, part of a communication bus or part of a memory system. The first processing stage comprises either a channel for communication of data or processing logic 1014, a non-delayed latch 1016, a delayed latch 1018, a comparator 1024 that compares outputs of the delayed latch and the non-delayed latch and outputs a control signal to a multiplexer 1020 determining whether the delayed signal value or the non-delayed signal value is supplied as input to a subsequent processing stage or channel 1016. The channel/logic 1014 and the non-delayed latch 1016 are driven by a non-delayed clock signal whereas the delayed latch 1019 is driven by a delayed clock signal which is a phase-shifted version of the non-delayed clock signal.

If the comparator 1024 detects a difference between the non-delayed signal value and the delayed signal value this indicates that either the processing operation was incomplete at the non-delayed capture time in the case that element 1014 represents processing logic or that the signal from the previous pipeline stage had not yet reached the present stage in the case of the element 1014 representing a data channel. In the event that such a difference is in fact detected, the value stored in the delayed latch 1018 is the more reliable data value since it was captured later when the processing operation is more likely to have been completed or the data from the previous stage is more likely to have arrived via the data channel. By supplying the result from the delayed latch to the next processing stage 1030 and suppressing use of the non-delayed value in subsequent processing stages, forward progress of the computation can be ensured. However, the reliability of the delayed signal value stored in the delayed latch 1018 can be compromised in the event that a single event upset occurred and corrupted the delayed value. The single event upset is effectively a pulse so it may well be missed by the non-delayed latch but picked up by the delayed latch. Such a single event upset will result in the comparator detecting a difference between the delayed and non-delayed values as a direct result of the single event upset and will then propagate the corrupted delayed value to subsequent processing stages. A single event upset that corrupts the non-delayed value will not be problematic since it will result in suppressing use of the erroneous non-delayed value and propagating the delayed value to subsequent stages.

The arrangement of FIG. 14 reduces the likelihood of a corrupted delayed value progressing through the computation by providing a cross-check of data integrity by provision of an error detection module 1026, an error correction module 1028 and a multiplexer 1022 that is controlled by the error detection module 1026 to supply either the delayed value from the delayed latch directly to the comparator 1024 or alternatively to supply an error corrected value output by the error correction module 1028. Upstream of the channel/logic unit 1014 a data payload of eight bits is error correction encoded and four redundancy bits are added to the data payload to form a twelve-bit signal. The twelve-bit signal passes through the channel/logic unit 1014 and its value is captured by both the non-delayed latch 1016 and the delayed latch 1018. However, a delayed value of the signal derived from the delayed latch 1018 is also supplied as input to the error detection module 1026, which determines from the 12-bit error-correction encoded signal whether any errors have occurred that affect the delayed value. In an alternative arrangement a further latch could be provided to supply a signal value to the error detection module 1018, that captures the signal value at a time slightly later than the delayed latch 1018. The error-checking must be performed on a value captured at the same time as the delayed value is captured or slightly later to ensure that any random error that occurred between capture of the non-delayed value and capture of the delayed value is detected.

A given error correction code is capable of detecting a predetermined number of errors and of correcting a given number of errors. Thus the error detection module 1026 detects whether any errors have occurred and, if so, if the number of errors is sufficiently small such that they are all correctable. If correctable errors are detected then the signal value is supplied to the error correction module 1028 where the errors are corrected using the error correction code and the corrected delayed value is supplied to the comparator 1024. If it is determined by the comparator 1024 that the corrected delayed value differs from the non-delayed value then the error recovery procedure is invoked so that further propagation of the non-delayed value is suppressed in subsequent processing stages and the operations are instead performed using the corrected delayed value. On the other hand, if the comparator 1024 determines that the corrected delayed value is the same as the delayed value then there are two alternative possibilities for progressing the calculation. Firstly, the error recovery mechanism could nevertheless be invoked so that the non-delayed value is suppressed in subsequent processing stages and replaced by the corrected delayed value. Alternatively, since the non-delayed value is determined to have been correct (as evidenced by the equality of the non-delayed value and the corrected delayed value), the error recovery mechanism could be suppressed (despite the detection of an error in the delayed value) thus allowing the non-delayed value to continue to progress through the subsequent processing stages. However, if uncorrectable errors are detected in the delayed value by the error detection module 1026 then a control signal is supplied to suppress use of the corrupted delayed value. In this case forward progress of the computation cannot be achieved. The type of error correction encoding applied differs according to the nature of the channel/processing logic 1014.

Processing logic can be categorised as either value-passing or value-altering. Examples of processing logic that is value-passing are memory, registers and multiplexers. Examples of value-altering processing logic elements are adders, multipliers and shifters. Error detection and correction for value-altering processing logic elements is more complex than for value-passing processing logic elements because even when no error has occurred the value output by the logic stage 1014 is likely to be different from the input twelve-bit signal 1013.

Figure 15:
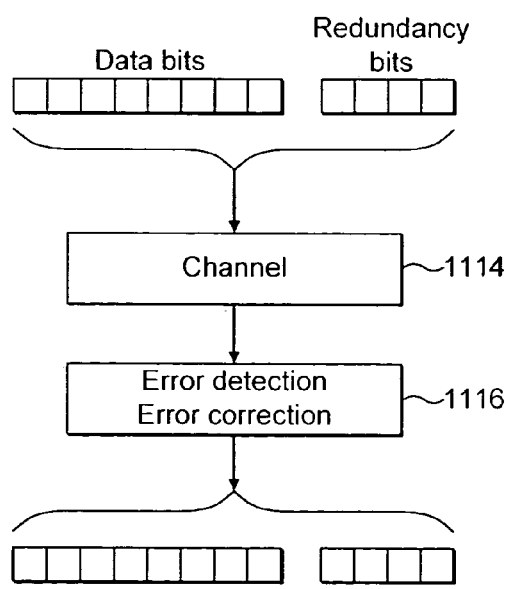
FIG. 15 schematically illustrates error correction for data passing through a channel that simply passes the data value unchanged from input to output if no errors occur.

FIG. 15 schematically illustrates error correction for data passing through a channel that simply passes the data value unchanged from input to output if no errors occur. In the case of such value-passing processing logic it is convenient to use a linear block code such as a Hamming code for error correction and detection. Linear block codes typically involve forming a codeword in which the original data payload bits remain in the codeword unchanged but some parity bits (or redundancy bits) are added. Hamming codes are simple single-bit error correction codes and for an (N, K) code, N is the total number of bits in the codeword and K is the number of data bits to be encoded. The presence and location of an error is detected by performing a number of parity checks on the output codeword. The Hamming code comprises N–K parity bits, each of which is calculated from a different combination of bits in the data. Hamming codes are capable of correcting one error or detecting two errors. The number of parity bits (or redundancy bits required is given by the Hamming rule $K+p+1 \leq 2^p$, where p is the number of parity bits and N=K+p.

As illustrated in FIG. 15 input to the channel is a 12 bit codeword comprising eight data bits and four parity or redundancy bits. Parity checks are performed by an error detection/correction module 1116 on the output from the channel 1114. Any single-bit error in the 12-bit codeword is detected and corrected prior to output of the codeword by the error detection/correction module 1116. If detected errors are uncorrectable the error detection/correction module 1116 outputs a signal indicating that this is the case. Although simple codes such as Hamming codes have been described in relation to FIG. 11 for use with value-passing processing logic, it will be appreciated that other error correction codes such as convolutional codes could alternatively be used.

Figure 16:
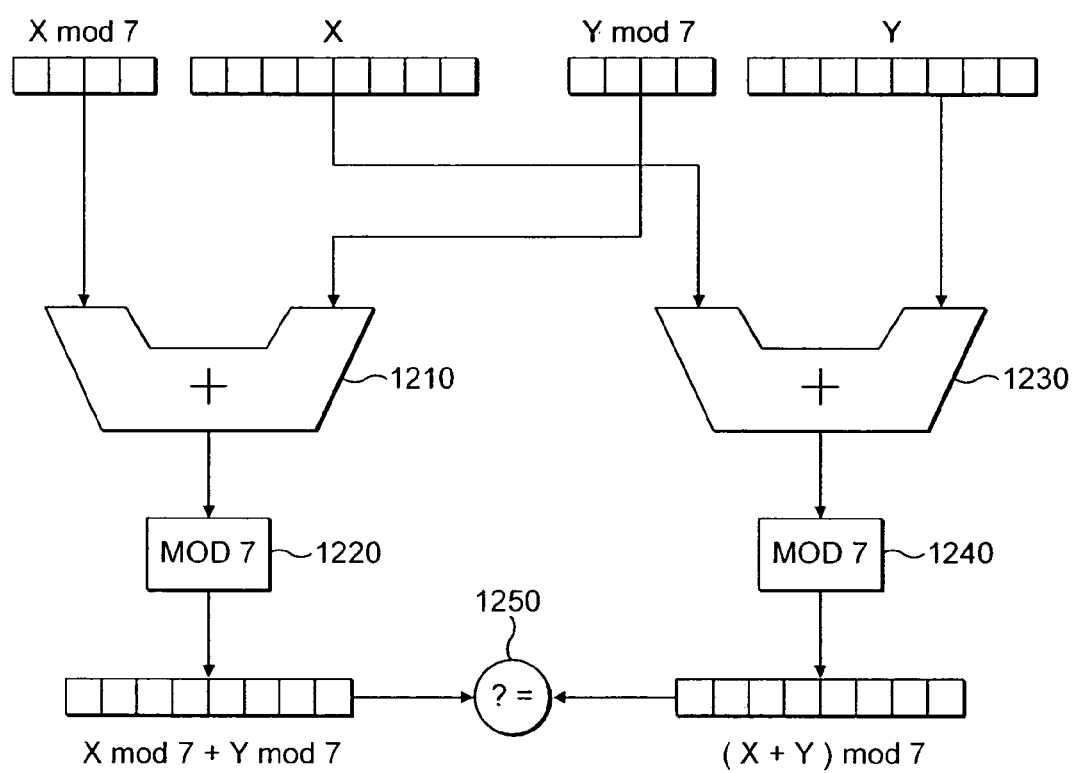
FIG. 16 schematically illustrates how error correction is performed for a value-changing logic element such as an adder, multiplier or shifter.

FIG. 16 schematically illustrates how error correction is performed for a value-changing logic element such as an adder, multiplier or shifter. In the case of value-altering processing logic arithmetic codes such as AN codes, residue codes, inverse residue codes or residue number codes may be used to detect and correct random errors in the output of the processing logic.

Arithmetic codes can be used to check arithmetic operators. Where represents the operator to be checked the following relation must be satisfied:

Code(X Y)=code Xcode Y

AN codes are arithmetic codes that involve multiplying the data word by a constant factor, for example a 3N code can be used to check the validity of an addition operation by performing the following comparison:

3N(X)+3N(Y)?=3N(X+Y)

3X+3Y?=3(X+Y).

A further example of a class of arithmetic codes are residue codes, in which a residue (remainder of division by a constant) is added to the data bits as check bits e.g. a 3R code involves modulo (MOD) 3 operations and the following check is applied:

X MOD 3+Y MOD 3?=(X+Y)MOD 3

Consider the numerical example of X=14 and Y=7:
14 MOD 3=2 (codeword 111010, with last two bits as residue);
7 MOD 3=1 (codeword 011101);
X+Y=21 (10101);
and 21 MOD 3=0;
sum of residues MOD 3=(2+1) MOD 3=0=residue of (X+Y).

FIG. 16 schematically illustrates use of a 7R arithmetic code for checking of an addition operation in the channel/logic units 1014 of FIG. 10. The addition operation to be checked is X+Y, where X and Y are eight-bit data words. Each data word has a four check bits having values X MOD 7 and Y MOD 7 respectively. X MOD 7 and Y MOD 7 are supplied as operands to a first adder 1210 and the output of this adder is supplied to logic that determines the value (X MOD 7+Y MOD 7) MOD 7 and supplies the result as a first input to a comparator 1250. A second adder 1230 performs the addition (X+Y), supplies the result to a logic unit 1240 that calculates (X+Y) MOD 7 and supplies the result as a second input to the comparator 1250. If the comparator detects any difference between the two input values then an error has occurred.

Figure 17:
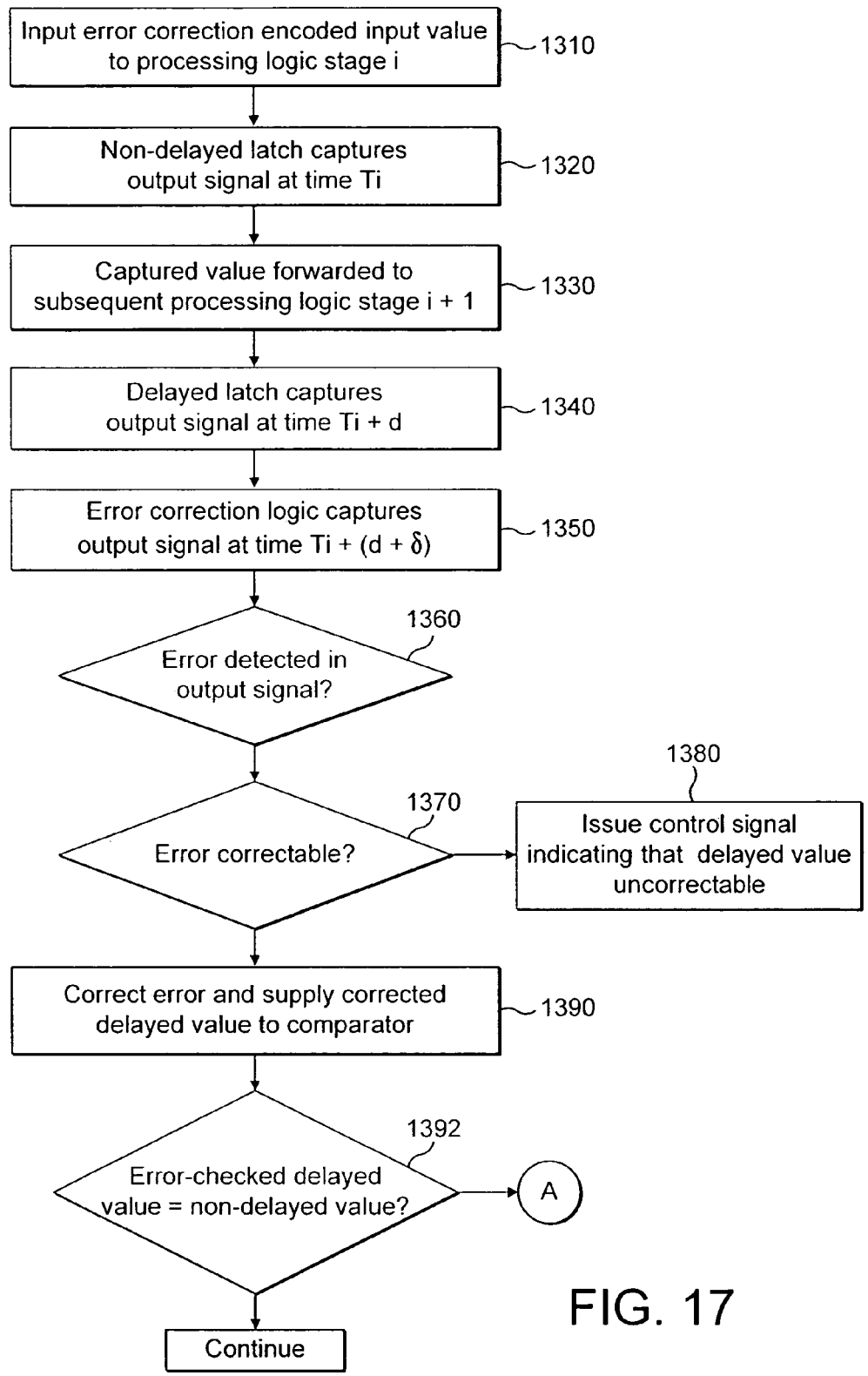
FIG. 17 is a flow chart schematically illustrating the operation of the circuit of FIG. 14.

FIG. 17 is a flow chart that schematically illustrates the operation of the circuit of FIG. 14 that comprises error correction control of the delayed latch value. At stage 1310 a twelve-bit error correction encoded signal value is input to the channel/logic unit 1014. Next, at stage 1320, the non-delayed latch 1016 captures the output from the channel/logic unit 1014 at time Ti and the captured value is forwarded to subsequent processing logic stage I+1 at stage 1330. At stage 1340 the delayed latch 1018 captures the output signal at time Ti+d. At stage 1350, the error detection logic captures the output from the channel/logic unit 1014 at time Ti+(d+δ). Although δ in preferred arrangements δ is zero so that value output by the delayed value itself is actually error checked, the output may alternatively be captured a short after the delayed latch captures the output signal at Ti+d. The capture of the value for supply to the error detection circuit is appropriately timed to ensure that any random error in the delayed value is detected. At stage 1360, the error detection module 1026 determines whether the delayed output signal has an error using the redundancy bits. If an error is detected it is then determined whether the error is correctable at stage 1370, which will depend on how many bits are affected. For example, a Hamming code can only correct a single bit error. If it is determined at stage 1370 that the error is correctable then the process proceeds to stage 1390, whereupon the error is corrected and the corrected delayed value is selected at the multiplexer 1022 and supplied to the comparator 1024. However, if it is determined at stage 1370 that detected errors are not correctable then a control signal is generated indicating that an uncorrectable error has occurred. In this case forward progress of the computation cannot be reliably performed. At stage 1392 the comparator 1024 determines whether the error-checked delayed value is equal to the non-delayed value and if so forward progress of the computation continues. Otherwise the process to the sequence of steps described in relation to FIG. 4B, involving suppression of the non-delayed value and its replacement by the delayed value in subsequent processing stages is carried out.

Figure 18:
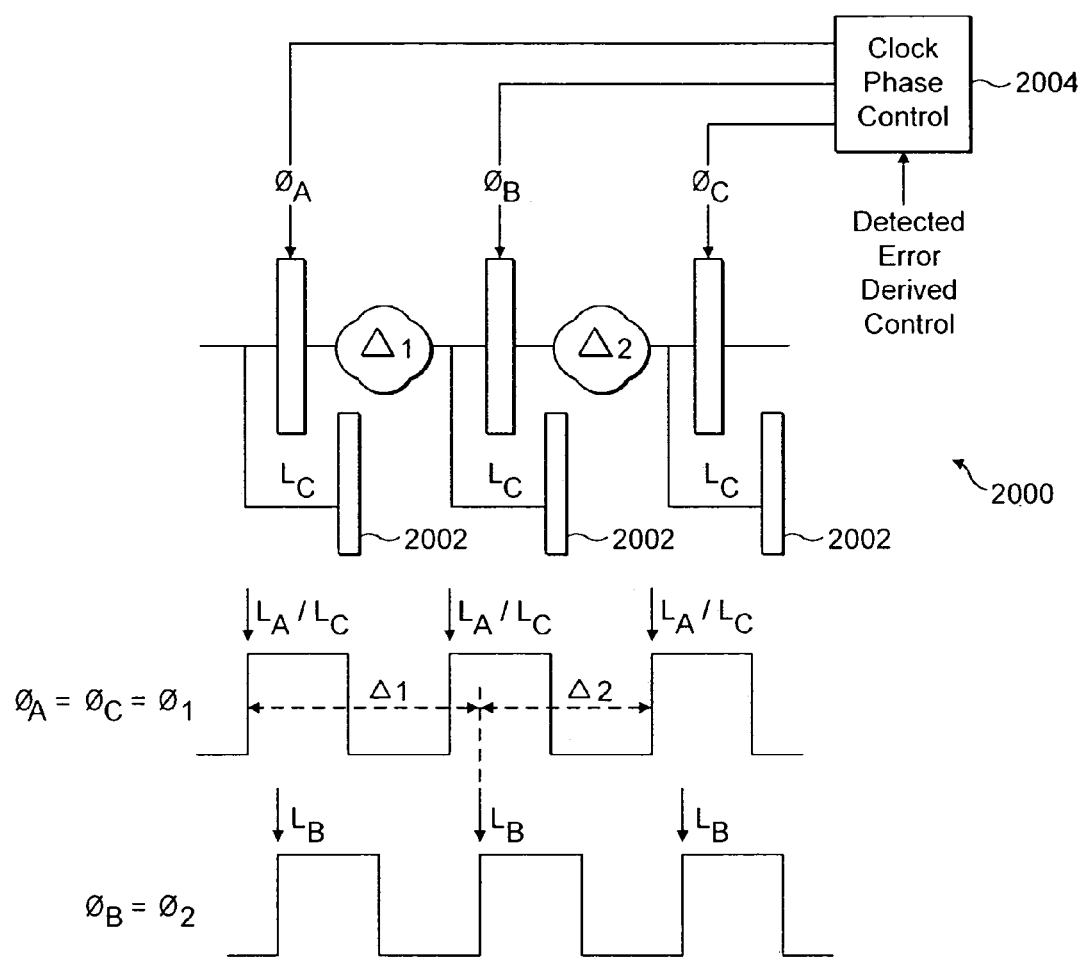
FIG. 18 schematically illustrates how delayed and non-delayed latches can be used to control the relative phases of clock signals within a processing pipeline.

FIG. 18 illustrates the use of the present technique to dynamically adjust the relative timing between processing stages. It is known that in a pipelined processing environment, the processing stages may take different times to complete their respective operations. Ideally the processing stages would all be balanced to take the same time and for their respective times to vary in the same way with changes in surrounding conditions. However, this is not practical in many cases and it may be that a collection of processing stages that are balanced at one operational voltage or temperature are not balanced at another operational voltage or temperature. Furthermore, manufacturing variation and other characteristics may result in considerable differences between processing stage timings which upsets the designed balance therebetween. In these cases, the clock frequency and other operational parameters are chosen with respect to a worst-case scenario such that the processing stages will be sufficiently closely balanced so as to be operational under all conditions.

The present technique allows a more selective and indeed dynamic approach to be taken. A pipelined processing circuit 2000 includes delayed latches 2002 which can be used to detect the occurrence of errors in the signal values being captured by the non-delayed latches. The occurrence of these errors is fed back to a clock phase control circuit 204 which serves to adjust the relative phases of the clock signals being supplied to respective latches within the main path, i.e. the non-delayed latches. In this way, an adjustment is made whereby time is effectively borrowed from one processing stage and allocated to another processing stage. This may be achieved by tapping the clock signals to be used by the respective non-delayed latches from selectable positions within a delay line along which the basic clock signal is propagated.

The illustrated example, the processing logic between latch $L_A$ and latch $L_B$ is slower in operation than the processing logic in the subsequent stage. Accordingly, the clock signal being supplied to the non-delayed latch $L_B$ can be phase shifted so as to delay the rising edge of that clock signal (assuming rising edge latch capture) and thereby to extend the time available for the slow processing logic. This reduces the time available for the processing logic within the subsequent processing stage assuming that this is operating on the same basic clock signal as the other stage elements excluding the latch $L_B$.

This timing balancing between processing stages can be performed dynamically during the ongoing operation of the circuit using feedback from the errors in operation detected using the delay latches. Alternatively, the balancing can be performed as a one-off operation during a manufacturing test stage or during a "golden boot" of the integrated circuit. The delayed latches shown in FIG. 18 are used for the purpose of timing balancing between processing stages and can thereafter be used for the control of operating parameters and error correction as discussed above, e.g. in relation to FIG. 1. In this way, the provision of the delayed latches is further used to also control relative clock timings.

Figure 19:
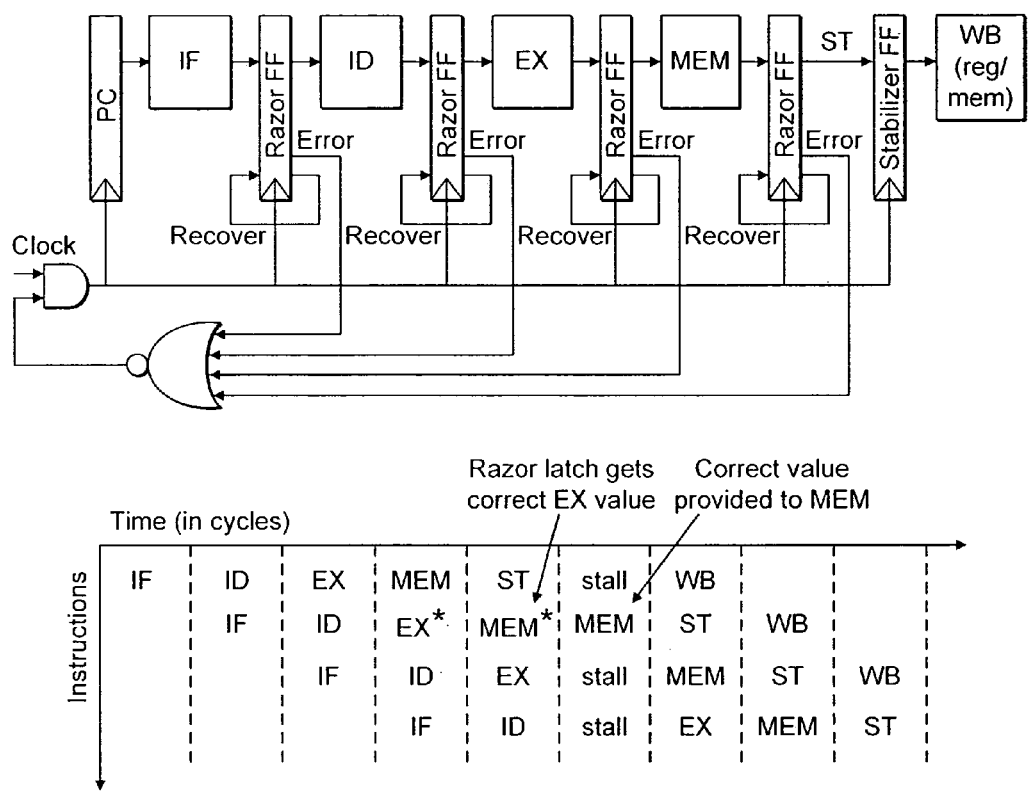
FIGS. 19 and 20 schematically illustrate respective uses of stalls and bubble insertion in recovering from errors.

FIG. 19 illustrates a simple approach to pipeline error recovery based on global clock gating. In the event that any stage detects an error, the entire pipeline is stalled for one cycle by gating the next global clock edge. The additional clock period allows every stage to recompute its result using the delayed latch as input. Consequently, any previously forwarded errant values will be replaced with the correct value from the delayed latch. Since all stages re-evaluate their result with the delayed latch input, any number of errors can be tolerated in a single cycle and forward progress is guaranteed. If all stages produce an error each cycle, the pipeline will continue to run, but at ½ the normal speed.

It is important that errant pipeline results not be written to architectured state before it has been validated by the comparator. Since validation of delayed values takes two additional cycles (i.e., one for error detection and one for panic detection), there must be two non-speculative stages between the last delayed latch and the writeback (WB) stage. In our design, memory accesses to the data cache are non-speculative, hence, only one additional stage labelled ST for stabilise is required before writeback (WB). The ST stage introduces an additional level of register bypass. Since store instructions must execute non-speculatively, they are performed in the WB stage of the pipeline.

FIG. 19 gives a pipeline timing diagram of a pipeline recovery for an instruction that fails in the EX stage of the pipeline. The first failed stage computation occurs in the $4^{th}$ cycle, but only after the MEM stage has computed an incorrect result using the errant value forward from the EX stage. After the error is detected, a global clock stall occurs in the $6^{th}$ cycle, permitting the correct EX result in the Razor shadow latch to be evaluated by the MEM stage. IN the $7^{th}$ cycle, normal pipeline operation resumes.

In aggressively clocked designs, it may not be possible to implement global clock gating without significantly impacting processor cycle time. Consequently, a fully pipelined error recover mechanism based on counterflow, pipelining techniques has been implemented. The approach, illustrated in FIG. 20, places negligible timing constraints on the baseline pipeline design at the expense of extending pipeline recovery over a few cycles. When a non-delayed value error is detected, two specific actions must be taken. First, the errant stage computation following the failing non-delayed latch must be nullified. This action is accomplished using the bubble signal, which indicates to the next and subsequent stages that the pipeline slot is empty. Second, the flush train is triggered by asserting the stage ID of failing stage. In the following cycle, the correct value from the delayed latch data is injected back into the pipeline, allowing the errant instruction to continue with its correct inputs. Additionally, there is a counterflow pipeline whereby the flush train begins propagating the ID of the failing stage in the opposite direction of instructions. At each stage visited by the active flush train, the corresponding pipeline stage and the one immediately preceding are replaced with a bubble. (Two stages must be nullified to account for the twice relative speed of the main pipeline.) When the flush ID reaches the start of the pipeline, the flush control logic restarts the pipeline at the instruction following the errant instruction. In the event that multiple stages experience errors in the same cycle, all will initiate recovery but only the non-delayed error closest to writeback (WB) will complete. Earlier recoveries will be flushed by later ones. Note that the counterflow pipeline may not be the same length as the forward pipeline so that, for example, the flush train of the counterflow pipeline could be two pipeline stages deep whereas the forward pipeline may be twelve stages deep.

Figure 20:
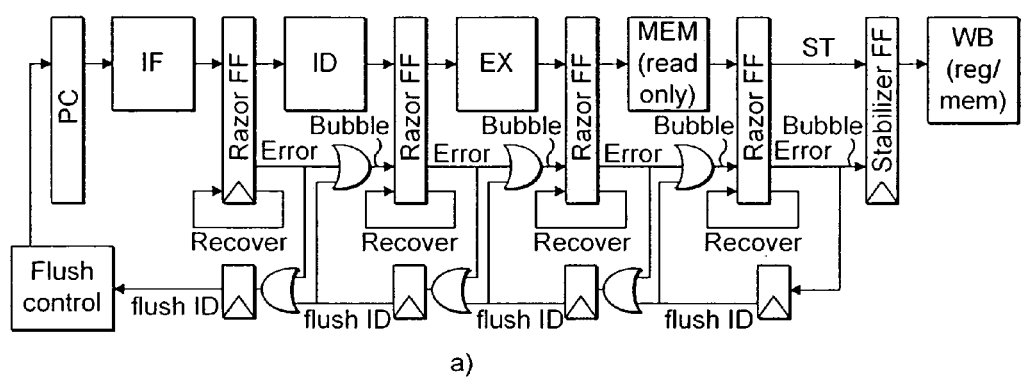
Figure 20:
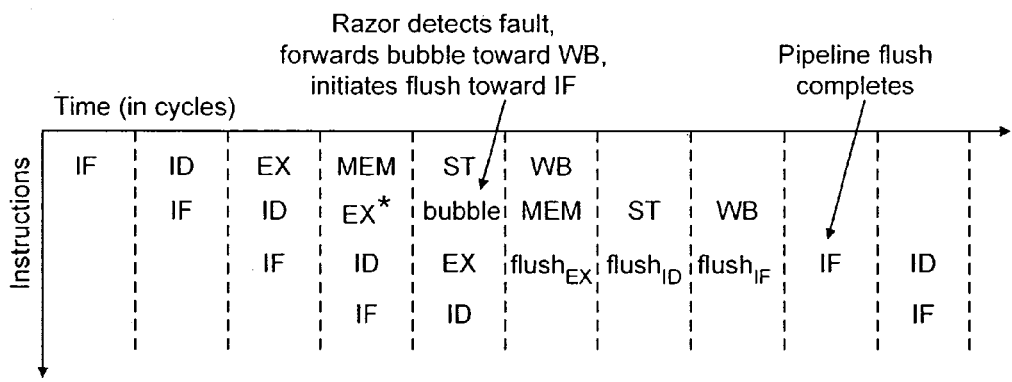

FIG. 20 shows a pipeline timing diagram of a pipelined recovery for an instruction that fails in the EX stage. As in the precious example, the first failed stage computation occurs in the $4^{th}$ cycle, when the second instruction computes an incorrect result in the EX stage of the pipeline. This error is detected in the $5^{th}$ cycle, causing a bubble to be propagated out of the MEM stage and initiation of the flush train. The instruction in the EX, 1D and IF stages are flushed in the $6^{th}$, $7^{th}$ and $8^{th}$ cycles, respectively. Finally, the pipeline is restarted after the errant instruction in cycle 9, after which normal pipeline operation resumes.

Recall from the description of FIG. 2 above, that in the event that circuits 102 detect meta-stability in the eror signal then a panic signal is asserted. In this case, the current instruction (rather than the next instruction) should be re-executed. When such a panic signal is asserted, all pipeline state is flushed and the pipeline is restarted immediately after the least instruction writeback. Panic situations complicate the guarantee of forward progress, as the delay in detecting the situation may result in the correct result being overwritten in the delayed latch. Consequently, after experiencing a panic, the supply voltage is reset to a known-safe operating level, and the pipeline is restarted. One re-tuned, the errant instruction should complete without errors as long as returning is prohibited until after this instruction completes.

A key requirement of the pipeline recover control is that it not fail under even the worst operating conditions (e.g. low voltage, high temperature and high process variation). This requirement is met through a conservative design approach that validates the timing of the error recovery circuits at the worst-case subcritical voltage.

Figure 21:
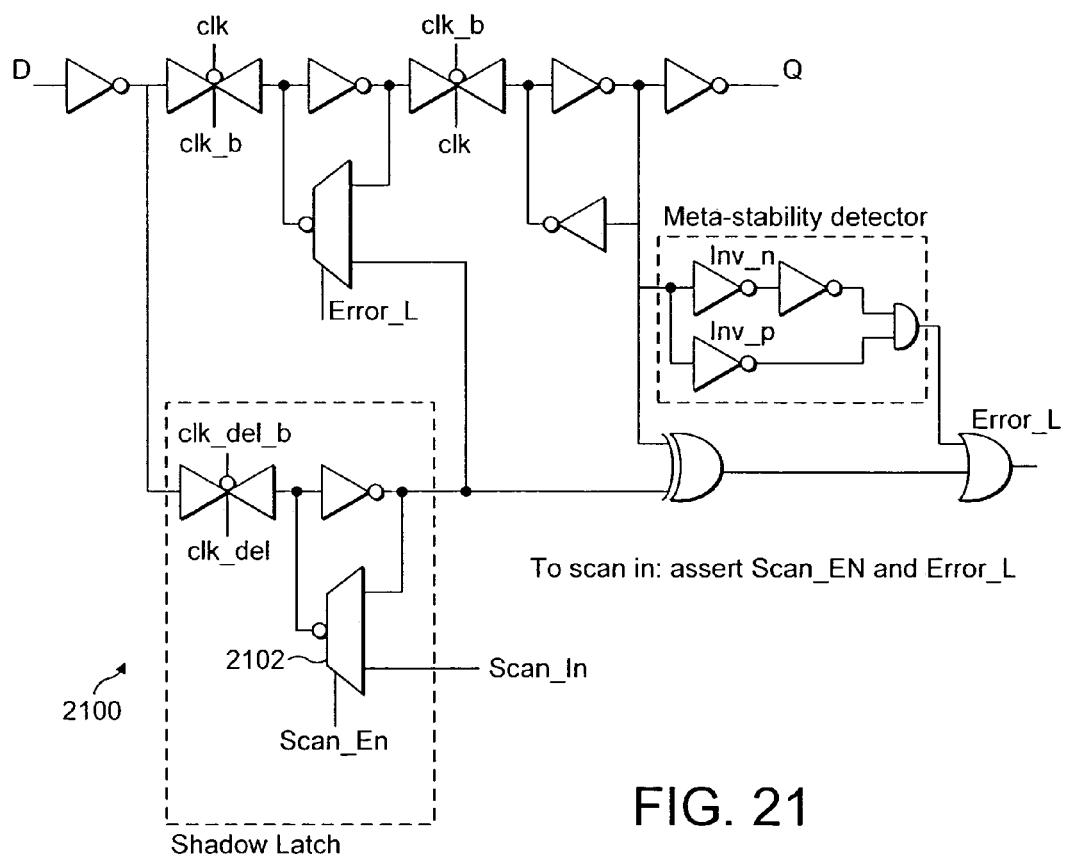
FIG. 21 illustrates a non-delayed and delayed latch for use between processing stages with the delayed latch being reused as a serial scan chain latch.

FIG. 21 schematically illustrates the re-use of a delayed latch 2100 as a serial scan chain latch. This is achieved by the provision of a multiplexer 2102 controlled by the scan enable signals which allow a serial scan data value to be written into the delay latch or serially read from the delayed latch as required. Furthermore, the normal mechanism which allows the delayed latch value to replace the non-delayed latch value is exploited to allow a serial scan chain value to be inserted into the operational path.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit for performing data processing, said integrated circuit comprising:
   a plurality of processing stages, a processing stage output signal from at least one processing stage being supplied as a processing stage input signal to a subsequent processing stage, wherein said at least one processing stage comprises:
   processing logic operable to perform a processing operation upon at least one coded input value to generate a processing logic output signal, said coded input value being an input value to which an error correction code has been applied;

a non-delayed signal-capture element operable to capture a non-delayed value of said processing logic output signal at a non-delayed capture time, said non-delayed value being supplied to said subsequent processing stage as said processing stage output signal following said non-delayed capture time;

a delayed signal-capture element operable to capture a delayed value of said processing logic output signal at a delayed capture time, later than said non-delayed capture time;

error correction logic operable to detect an occurrence of a random error in said delayed value of said processing logic output signal, to determine if said detected random error is correctable using said error correction code and to either generate an error-checked delayed value or to indicate that said detected random error is not correctable;

a comparator operable to compare said non-delayed value with said error-checked delayed value to detect a change in said processing logic output signal at a time following said non-delayed capture time, said change being indicative of a systematic error whereby said processing logic has not finished said processing operation at said non-delayed capture time or of a random error in said non-delayed value; and error-repair logic operable when said comparator detects said change in said processing logic output signal to perform an error-repair operation suppressing use of said non-delayed value either by replacing said non-delayed value by said error-checked delayed value in subsequent processing stages or by initiating repetition of said processing operation and processing operations of subsequent processing stages if said error correction logic indicates that said detected random error is not correctable.

2. An integrated circuit as claimed in claim 1, wherein said error repair logic is operable to suppress use of said non-delayed value by replacing said non-delayed value with said error-checked delayed value in the event that said error correction logic detects a correctable random error in said delayed value and said comparator detects that there is no difference between said non-delayed value and said error-checked delayed value.

3. An integrated circuit as claimed in claim 1, wherein said plurality of processing stages are respective pipeline stages within a synchronous pipeline.

4. An integrated circuit as claimed in claim 1, comprising a meta-stability detector operable to detect meta-stability in said non-delayed value and trigger said error-repair logic to suppress use of said non-delayed value if found to be meta-stable.

5. An integrated circuit as claimed in claim 1, wherein when said comparator detects said change said error-repair logic is operable to force said error-checked delayed value to be stored in said non-delayed signal-capture element in place of said non-delayed value.

6. An integrated circuit as claimed in claim 1, wherein a maximum processing time taken for said processing operation is less than a sum of a time separating said delayed capture time from said non-delayed capture time and a time between non-delayed capture times such that said processing logic will have completed said processing operation by said delayed capture time.

7. An integrated circuit as claimed in claim 1, wherein said processing stages are part of a data processor.

8. An integrated circuit as claimed in claim 1, wherein said processing operation performed by said processing logic is a value-altering operation for which said processing logic output signal can be different from said processing stage input value even when no errors occur in said processing operation.

9. An integrated circuit as claimed in claim 8, wherein said processing logic is one of: an adder, a multiplier or a shifter.

10. An integrated circuit as claimed in claim 1, wherein when said comparator detects said change said error-repair logic is operable to replace said non-delayed value with said error-checked delayed value as said processing stage output signal.

11. An integrated circuit as claimed in claim 10, wherein supply of said error-checked delayed value to said following processing stage forces forward progress through processing operations.

12. An integrated circuit as claimed in claim 1, wherein a minimum processing time taken for said processing operation is greater than a time separating said delayed capture time from said non-delayed capture time such that said error-checked delayed value is not influenced by a processing operation performed upon different input values.

13. An integrated circuit as claimed in claim 12, wherein said processing logic includes one or more delay elements to ensure said minimum processing time is exceeded.

14. An integrated circuit as claimed in claim 1, comprising an error counter circuit operable to store a count of detection of errors corresponding to said change.

15. An integrated circuit as claimed in claim 14, wherein said count may be read by software.

16. An integrated circuit as claimed in claim 1, wherein said processing operation performed by said processing logic is an operation for which said processing logic output signal is substantially equal to said processing stage input value when no errors occur in said processing operation.

17. An integrated circuit as claimed in claim 16, wherein said at least one processing stage is performed by a memory circuit and said processing operation is a read or write operation.

18. An integrated circuit as claimed in claim 16, wherein at least one processing stage is performed by a register and said processing operation is a read, write or move operation.

19. An integrated circuit as claimed in claim 16, wherein said at least one processing stage is performed by a multiplexer and said processing operation is a multiplexing operation.

20. An integrated circuit as claimed in claim 16, wherein said input value is error correction encoded using a Hamming code and said error repair logic performs said correction and said detection using said Hamming code.

21. An integrated circuit as claimed in claim 20, wherein said input value is error correction encoded using an arithmetic code comprising one of: an AN code, a residue code, an inverse residue code or a residue number code.

22. An integrated circuit as claimed in claim 1, wherein processing operations within said at least one processing stage and said subsequent processing stages are driven by a non-delayed clock signal.

23. An integrated circuit as claimed in claim 22, wherein when said comparator detects said change said error-repair logic is operable to gate said non-delayed clock signal to provide time for said following processing stage to recover from input of said non-delayed value and instead use said error-checked delayed value.

24. An integrated circuit as claimed in claim 22, wherein said non-delayed capture time is derived from a predetermined phase point of said non-delayed clock signal, a phased delayed version of said non-delayed clock signal is used as a delayed clock signal and said delayed capture time is derived from a predetermined phase point of said delayed clock signal.

25. An integrated circuit as claimed in claim 1, wherein one or more operating parameters of said integrated circuit are controlled in dependence upon detection of said systematic errors corresponding to said change.

26. An integrated circuit as claimed in claim 25, wherein said one or more operating parameters are controlled to have a level at which a non-zero systematic error rate is maintained.

27. An integrated circuit as claimed in claim 25, wherein said one or more operating parameters include at least one of:
 an operating voltage;
 an operating frequency;
 an integrated circuit body bias voltage; and
 temperature.

28. A method of controlling an integrated circuit for performing data processing, said method comprising the steps of:
 supplying a processing stage output signal from at least one processing stage of a plurality of processing stages as a processing stage input signal to a subsequent processing stage, said at least one processing stage operating to:
 perform a processing operation with processing logic upon at least one coded input value to generate a processing logic output signal, said coded input value being an input value to which an error correction code has been applied;
 capturing a non-delayed value of said processing logic output signal at a non-delayed capture time, said non-delayed value being supplied to said subsequent processing stage as said processing stage output signal following said non-delayed capture time;
 capturing a delayed value of said processing logic output signal at a delayed capture time later than said non-delayed capture time;
 detect an occurrence of a random error in said delayed value of said processing logic output signal using error correction logic, to determine if said detected random error is correctable using said error correction code and to either generate an error-checked delayed value or to indicate that said detected random error is not correctable;
 comparing said non-delayed value with said error-checked delayed value to detect a change in said processing logic output signal at a time following said non-delayed capture time, said change being indicative of a systematic error whereby said processing logic has not finished said processing operation at said non-delayed capture time or of a random error in said non-delayed value; and
 when said change is detected, performing an error-repair operation using error-repair logic suppressing use of said non-delayed value by replacing said non-delayed value by said error-checked delayed value in subsequent processing stages or by initiating repetition of said processing operation and processing operations of subsequent processing stages if said error correction logic indicates that said detected random error is not correctable.

29. A method as claimed in claim 28, wherein said error repair logic is operable to suppress use of said non-delayed value by replacing said non-delayed value with said error-checked delayed value in the event that said error correction logic detects a correctable random error in said delayed value and said comparator detects that there is no difference between said non-delayed value and said error-checked delayed value.

30. A method as claimed in claim 28, wherein said plurality of processing stages are respective pipeline stages within a synchronous pipeline.

31. A method as claimed in claim 28, comprising a meta-stability detection in said non-delayed value and triggering of said error-repair logic to suppress use of said non-delayed value if found to be meta-stable.

32. A method as claimed in claim 28, wherein when said change is detected by said comparator said error-repair logic is operable to replace said non-delayed value with said error-checked delayed value as said processing stage output signal.

33. A method as claimed in claim 28, wherein supply of said error-checked delayed value to said following processing stage forces forward progress through processing operations.

34. A method as claimed in claim 28, wherein when said change is detected by said comparator, said error-repair logic is operable to force said error-checked delayed value to be stored in said non-delayed signal-capture element in place of said non-delayed value.

35. A method as claimed in claim 28, wherein a maximum processing time taken for said processing operation is less than a sum of a time separating said delayed capture time from said non-delayed capture time and a time between non-delayed capture times such that said processing logic will have completed said processing operation by said delayed capture time.

36. A method as claimed in claim 28, wherein said processing stages are part of a data processor.

37. A method as claimed in claim 28, wherein a minimum processing time taken for said processing operation is greater than a time separating said delayed capture time from said non-delayed capture time such that said error-checked delayed value is not influenced by a processing operation performed upon different input values.

38. A method as claimed in claim 37, wherein said processing logic includes one or more delay elements to ensure said minimum processing time is exceeded.

39. A method as claimed in claim 28, comprising an error counter circuit operable to store a count of detection of errors corresponding to said change.

40. A method as claimed in claim 39, wherein said count may be read by software.

41. A method as claimed in claim 28, wherein said processing operation performed by said processing logic is a value-altering operation for which said processing logic output signal can be different from said processing stage input value even when no errors occur in said processing operation.

42. A method as claimed in claim 41, wherein said processing logic is one of: an adder, a multiplier or a shifter.

43. A method as claimed in claim 41, wherein said input value is error correction encoded using an arithmetic code comprising one of: an AN code, a residue code, an inverse residue code or a residue number code.

44. A method as claimed in claim 28, wherein processing operations within said at least one processing stage and said subsequent processing stages are driven by a non-delayed clock signal.

45. A method as claimed in claim 44, wherein when said change is detected by said comparator, said error-repair logic is operable to gate said non-delayed clock signal to provide time for said following processing stage to recover from input of said non-delayed value and instead use said error-checked delayed value.

46. A method as claimed in claim 44, wherein said non-delayed capture time is derived from a predetermined phase point of said non-delayed clock signal, a phased delayed version of said non-delayed clock signal is used as a delayed clock signal and said delayed capture time is derived from a predetermined phase point of said delayed clock signal.

47. A method as claimed in claim 28, wherein one or more operating parameters of said integrated circuit are controlled in dependence upon detection of said systematic errors corresponding to said change.

48. A method as claimed in claim 47, wherein said one or more operating parameters are controlled to have a level at which a non-zero systematic error rate is maintained.

49. A method as claimed in claim 47, wherein said one or more operating parameters include at least one of:

an operating voltage;

an operating frequency;

an integrated circuit body bias voltage; and temperature.

50. A method as claimed in claim 28, wherein said processing operation performed by said processing logic is an operation for which said processing logic output signal is substantially equal to said processing stage input value when no errors occur in said processing operation.

51. A method as claimed in claim 50, wherein said at least one processing stage is performed by a memory circuit and said processing operation is a read or write operation.

52. A method as claimed in claim 50, wherein at least one processing stage is performed by a register and said processing operation is a read, write or move operation.

53. A method as claimed in claim 50, wherein said at least one processing stage is performed by a multiplexer and said processing operation is a multiplexing operation.

54. A method as claimed in claim 50, wherein said input value is error correction encoded using a Hamming code and said error repair logic performs said correction and said detection using said Hamming code.

* * * * *